United States Patent
Kawase

(10) Patent No.: US 6,351,119 B1
(45) Date of Patent: Feb. 26, 2002

(54) MAGNETIC DETECTING ELEMENT UTILIZING MAGNETIC IMPEDANCE EFFECT

(75) Inventor: Masahiro Kawase, Saitama-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/229,112

(22) Filed: Jan. 13, 1999

Related U.S. Application Data

(62) Division of application No. 08/618,066, filed on Mar. 25, 1996, now Pat. No. 5,889,403.

(30) Foreign Application Priority Data

| Mar. 31, 1995 | (JP) | 7-075582 |
| Apr. 18, 1995 | (JP) | 7-092465 |
| May 29, 1995 | (JP) | 7-129888 |
| Jun. 30, 1995 | (JP) | 7-164834 |

(51) Int. Cl.$^7$ .......................... G01R 33/02; G11B 5/33
(52) U.S. Cl. ..................... 324/249; 324/260; 360/110
(58) Field of Search ........................ 324/244, 249, 324/252, 260; 428/900; 360/110, 125; 235/449; 427/132

(56) References Cited

U.S. PATENT DOCUMENTS

| 4,429,276 A | * | 1/1984 | Narimatsu | 324/252 X |
| 4,635,152 A | * | 1/1987 | Iwasaki et al. | 324/249 X |
| 4,767,989 A | * | 8/1988 | Meyer et al. | 324/252 |
| 5,031,063 A | * | 7/1991 | Hasegawa | 360/120 |
| 5,168,410 A | * | 12/1992 | Liao | 360/125 |
| 5,182,690 A | * | 1/1993 | Katori et al. | 360/120 |
| 5,365,391 A | * | 11/1994 | Sugiyama et al. | 360/110 |
| 5,559,433 A | * | 9/1996 | Onizuka | 324/252 X |
| 5,705,926 A | * | 1/1998 | Senda et al. | 324/249 X |
| 5,838,154 A | * | 11/1998 | Morikawa et al. | 324/249 |
| 5,889,403 A | * | 3/1999 | Kawase | 324/249 |

FOREIGN PATENT DOCUMENTS

| EP | 0472162 | * | 2/1992 | 324/249 |

OTHER PUBLICATIONS

Iwasaki et al; "Film Thickness And . . . Using Induced RF Permeability Change", IEEE Transactions on Magnetics, vol. MAG–23, No. 5, pp. 2506–2508, Sep. 1987.*

Senda et al; "High Frequency Measurement . . . with Magnetic Film . . . Inductance Line", Rev. Sci. Instruments 64(4) pp. 1034–1037, Apr. 1993.*

Japanese Laid–Open Patent Application No. 6–281712, published 1994 (Oct. 7, 1994).

* cited by examiner

Primary Examiner—Gerard R. Strecker
(74) Attorney, Agent, or Firm—Robin, Blecker & Daley

(57) ABSTRACT

In a magnetic detecting element utilizing a magnetic impedance effect, a high-permeability magnetic film is formed on a non-magnetic substrate and has magnetic anisotropy in a predetermined direction in the plane of the magnetic film. A high-frequency current is applied across two point in a direction perpendicular to the direction of the magnetic anisotropy, and a change in impedance generated between the two points is converted into an electric signal to obtain an output.

19 Claims, 15 Drawing Sheets

COLPITTS OSCILLATOR

MULTIVIBRATOR OSCILLATOR

MULTIVIBRATOR TYPE OSCILLATION CIRCUIT

MAGNETIC DETECTING ELEMENT UTILIZING MAGNETIC IMPEDANCE EFFECT

CROSS-REFERENCE TO RELATED APPLICATIONS

This application is a divisional of application Ser. No. 08/618,066, filed Mar. 25, 1996 now U.S. Pat. No. 5,889,403.

BACKGROUND OF THE INVENTION

1. Field of the Invention

This invention relates to a magnetic detecting element and, more particularly, to a magnetic detecting element for detecting an external magnetic field by utilizing a magnetic impedance effect.

2. Description of the Related Art

Although the recent magnetic sensor has become diversified with rapid development of an information equipment or a measuring/controlling equipment, miniaturization and high precision of the magnetic sensor are expected in the future. In the field of a magnetic head, a digital magnetic recording equipment is miniaturized. For example, in a hard disk drive serving as an external storage device of a computer or a digital compact cassette recorder (DCC) serving as a digital audio equipment, since an S/N ratio decreases due to decreases in track width and relative speed in a conventional induction type magnetic head, a magnetoresistive effect element (to be referred to as an MR element hereinafter) is used as a reproducing head. However, the MR element has no speed dependency of a medium, and is suitable for output extraction at a low speed, but the MR element has a resistance change rate of only several %. For this reason, development of a higher-sensitivity element is demanded for high-density integration in the future.

In the field of a sensor such as a magnetic encoder, a magnetic flux leaking outside becomes externally small by decreasing a magnetizing pitch of an adhered magnetic material, and low sensitivity poses a problem even in an MR element.

Recently, a magnetic detecting element utilizing a magnetic impedance (to be referred to as MI hereinafter) effect disclosed in Japanese Laid-Open Patent Application No. Hei 6-281712 has attracted attention. This uses the following phenomenon. That is, a high-frequency current of an MHz band flows in a wire made of magnetic material, and magnetization in a state where the magnetic domain wall of circular magnetization does not easily move is rotated by applying an external magnetic field, thereby largely changing permeability. A change in permeability causes a change in impedance.

Merits of such an element are as follows. That is, the element is free from the influence of a diamagnetic field because the element does not excite in the longitudinal direction of a magnetic material, and is suitable for miniaturization because the length of the element can be shortened to be about 1 mm or less. The element obtains a high resolution of flux detection of $10^{-5}$ [Oe], while an MR element obtains a low resolution of flux detection of 0.1 [Oe]. In addition, while an MR element obtains an amount of change in impedance of about 3%, the element utilizing the MI effect obtains a several 10%-order change in impedance.

Since the element utilizing the MI effect has an impedance whose inductance component largely changes, the element is incorporated as an inductor L of a Colpitts oscillator shown in FIG. 1 or a multivibrator oscillator shown in FIG. 2. In that instance, a change in inductance caused by an external magnetic field is converted by amplitude modulation, and is then outputted after being subjected to frequency detection.

The functions of the element utilizing the MI effect have been found in an amorphous wire. The amorphous wire has excellent productivity as a material. However, when the amorphous wire is applied to a magnetic sensor, if the wire has a circular section having a diameter of several 10 microns, the wire cannot be easily handled.

More specifically, since the wire has the circular end portion having a several 10 microns with respect to a recording medium having a recording wavelength of several microns or less, the element cannot absorb a flux due to a shaping loss at the end portion. In addition, since the wire having a diameter of several 10 microns can be easily bent, handling such as alignment of elements cannot be easily performed.

For this reason, if a magnetic detecting element utilizing the MI effect can be constituted by a thin film, the element can be suitable for miniaturization because the thickness, width, and length on the substrate can be freely selected. However, in order to constitute the element by a thin film, the following points are required.

1) An MI effect which has quality higher than that of an amorphous wire is obtained.
2) The element has static characteristics (high Q (quality factor) value) so that the element can be incorporated in an oscillation circuit.

SUMMARY OF THE INVENTION

This invention aims to provide a magnetic detecting element in which the above conditions can be achieved, magnetic detection can be performed by an MI effect such that the main body of the element is constituted by a thin film, and performance higher than that of an element constituted by an amorphous wire and handling easier than that of the element constituted by the amorphous wire can be attained.

In order to achieve the above object, according to an embodiment of the present invention, there is provided a magnetic detecting element utilizing a magnetic impedance effect comprising a non-magnetic substrate, a high-permeability magnetic film formed on the non-magnetic substrate and having magnetic anisotropy in a predetermined direction in a plane of the magnetic film, applying means for applying a high-frequency current across two points in a direction perpendicular to the direction of the magnetic anisotropy, and output means for converting a change in impedance generated between the two points into -an electric signal and outputting the electric signal.

According to another aspect of the present invention, there is provided a magnetic detecting element utilizing a magnetic impedance effect, characterized in that the magnetic detecting element is constituted by forming a substantially rectangular high-permeability magnetic film on a non-magnetic substrate, the high-permeability magnetic film is arranged to have a longitudinal direction along an applying direction of an external magnetic field to be detected and to have magnetic anisotropy such that an easy direction of magnetization is perpendicular to the longitudinal direction in a plane of the high-permeability magnetic film, a high-frequency current is applied to the high-permeability magnetic film from both end portions thereof in the longitudinal direction, and a change in impedance generated by the external magnetic field between both the end portions of the high-permeability magnetic film in the longitudinal direction is converted into an electric signal to obtain an output.

According to still another aspect of the present invention, there is provided a magnetic detecting element utilizing a magnetic impedance effect, characterized in that the magnetic detecting element is constituted by stacking on a non-magnetic substrate, as layers in order from below, a high-permeability magnetic film, an insulating film and a conductive film which each have a substantially rectangular shape, each of the respective layers of the high-permeability magnetic film, the insulating film and the conductive film is arranged to have a longitudinal direction along an applying direction of an external magnetic field to be detected, the high-permeability magnetic film has magnetic anisotropy such that an easy direction of magnetization is perpendicular to the longitudinal direction in a plane of the high-permeability magnetic film, a high-frequency current is applied to the conductive film from both end portions thereof in the longitudinal direction, and a change in impedance generated by the external magnetic field between both the end portions of the conductive film in the longitudinal direction is converted into an electric signal to obtain an output.

According to still another aspect of the present invention, there is provided a magnetic detecting element utilizing a magnetic impedance effect, characterized in that the magnetic detecting element is constituted by stacking on a non-magnetic substrate, as layers in order from below, a high-permeability magnetic film and a conductive film which each have a substantially rectangular shape, each of the respective layers of the high-permeability magnetic film and the conductive film is arranged to have a longitudinal direction along an applying direction of an external magnetic field to be detected, the high-permeability magnetic film has an electric resistivity considerably higher than that of the conductive film and has magnetic anisotropy such that an easy direction of magnetization is perpendicular to the longitudinal direction in a plane of the high-permeability magnetic film, a high-frequency current is applied to the conductive film from both end portions thereof in the longitudinal direction, and a change in impedance generated by the external magnetic field between both the end portions of the conductive film in the longitudinal direction is converted into an electric signal to obtain an output.

According to still another aspect of the present invention, there is provided a magnetic detecting element utilizing a magnetic impedance effect, characterized in that the magnetic detecting element is constituted by forming a high-permeability magnetic film on a non-magnetic substrate, the high-permeability magnetic film is formed to have a zigzag pattern having a plurality of straight portions along a magnetic field detection direction which are arranged in parallel at predetermined intervals and interconnected to be sequentially folded and to be electrically connected in series with each other, and has magnetic anisotropy such that an easy direction of magnetization is perpendicular to the magnetic field detection direction in a plane of the high-permeability magnetic film, a high-frequency current is applied from both end portions of the high-permeability magnetic film, and a change in impedance generated by an external magnetic field between both the end portions of the high-permeability magnetic film is converted into an electric signal to obtain an output.

According to still another aspect of the present invention, there is provided a magnetic detecting element utilizing a magnetic impedance effect, characterized in that the magnetic detecting element is constituted by stacking on a non-magnetic substrate, as layers in order from below, a first high-permeability magnetic film, a first insulating film, a conductive film, a second insulating film and a second high-permeability magnetic film, at least one of the first and second high-permeability magnetic films has magnetic anisotropy such that an easy direction of magnetization is perpendicular to a magnetic field detection direction in a plane of the at least one of the first and second high-permeability magnetic films, the conductive film is formed to have a zigzag pattern having a plurality of straight portions along the magnetic field detection direction which are arranged in parallel at predetermined intervals and interconnected to be sequentially folded and to be electrically connected in series with each other, a high-frequency current is applied from both end portions of the conductive film, and a change in impedance generated by an external magnetic field between both the end portions of the conductive film is converted into an electric signal to obtain an output.

In addition, as the application of the above magnetic detecting element, there is provided a magnetic head for reproduction utilizing a magnetic impedance effect, characterized in that the magnetic head is constituted by forming first and second high-permeability magnetic films on a surface, of a non-magnetic substrate having an end surface formed as a magnetic recording medium sliding surface, substantially perpendicular to the sliding surface, the first high-permeability magnetic film is formed to have a zigzag pattern having a plurality of straight portions along a direction perpendicular to the sliding surface which are arranged at a distance from the sliding surface and in parallel at predetermined intervals and interconnected to be sequentially folded and to be electrically connected in series with each other, and has magnetic anisotropy such that an easy direction of magnetization is substantially parallel to the sliding surface in a plane of the first high-permeability magnetic film, the second high-permeability magnetic film is formed to overlap folded portions of the zigzag pattern of the first high-permeability magnetic film on the side of the sliding surface through an insulating film and to extend up to the sliding surface, a high-frequency current is applied from both end portions of the first high-permeability magnetic film, and a change in impedance generated between both the end portions of the first high-permeability magnetic film by a magnetic field applied from a magnetic recording medium to the first high-permeability magnetic film through the second high-permeability magnetic film is converted into an electric signal to obtain a reproduction output.

According to another aspect of the present invention, there is provided a magnetic head for reproduction utilizing a magnetic impedance effect, characterized in that the magnetic head is constituted by forming, as layers in order from below, a first high-permeability magnetic film, a first insulating film, a conductive film, a second insulating film and a second high-permeability magnetic film on an upper surface, of a non-magnetic substrate having an end surface formed as a magnetic recording medium sliding surface, substantially perpendicular to the sliding surface, at least one of the first and second high-permeability magnetic films has magnetic anisotropy such that an easy direction of magnetization is substantially parallel to the sliding direction in a plane of the at least one of the first and second high-permeability magnetic films, the first high-permeability magnetic film has an end portion exposed to the sliding surface, the conductive film is formed to have a zigzag pattern having a plurality of straight portions along a direction substantially perpendicular to the sliding surface which are arranged in parallel at predetermined intervals and interconnected to be sequentially folded and to be electrically connected in series with each other, a high-frequency current is applied from both end portions of the conductive film, and a change in impedance generated between both the end portions of the conductive film by a magnetic field from a magnetic recording medium is converted into an electric signal to obtain a reproduction output.

The above and other objects and features of the invention will become apparent from the following detailed description of embodiments thereof taken in connection with the accompanying drawings.

DETAILED DESCRIPTION OF THE PREFERRED EMBODIMENTS

Embodiments of the present invention will be described below with reference to the accompanying drawings.

[First Embodiment]

Figure 1:
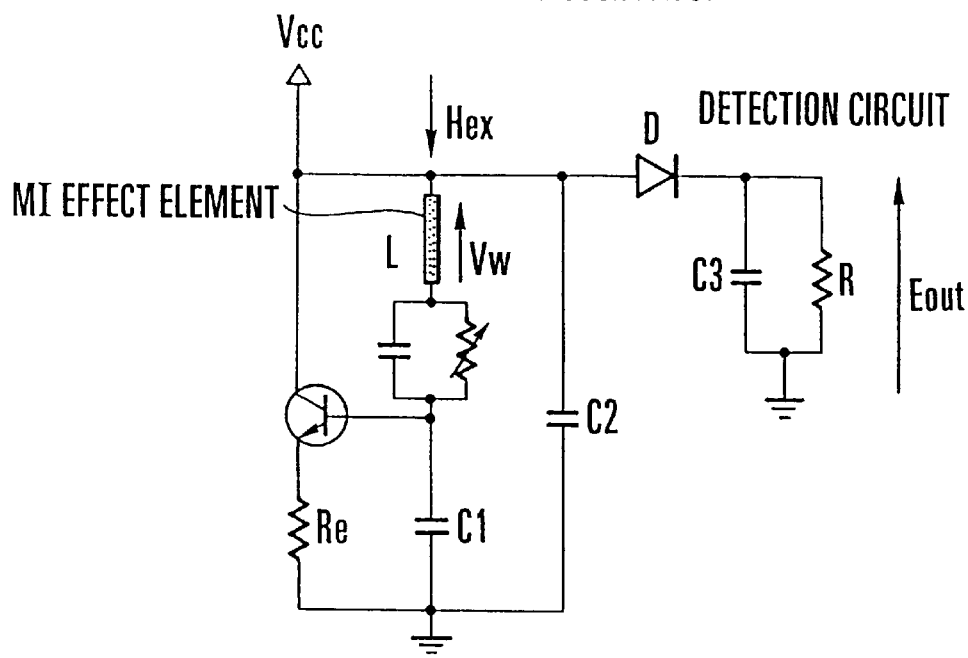
FIG. 1 is a circuit diagram of a Colpitts oscillator.
Figure 2:
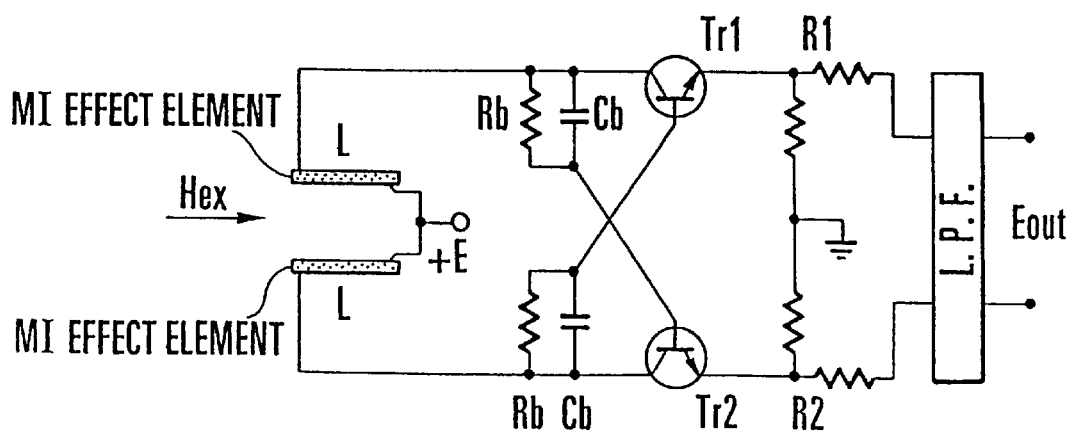
FIG. 2 is a circuit diagram of a multivibrator oscillator.
Figure 3:
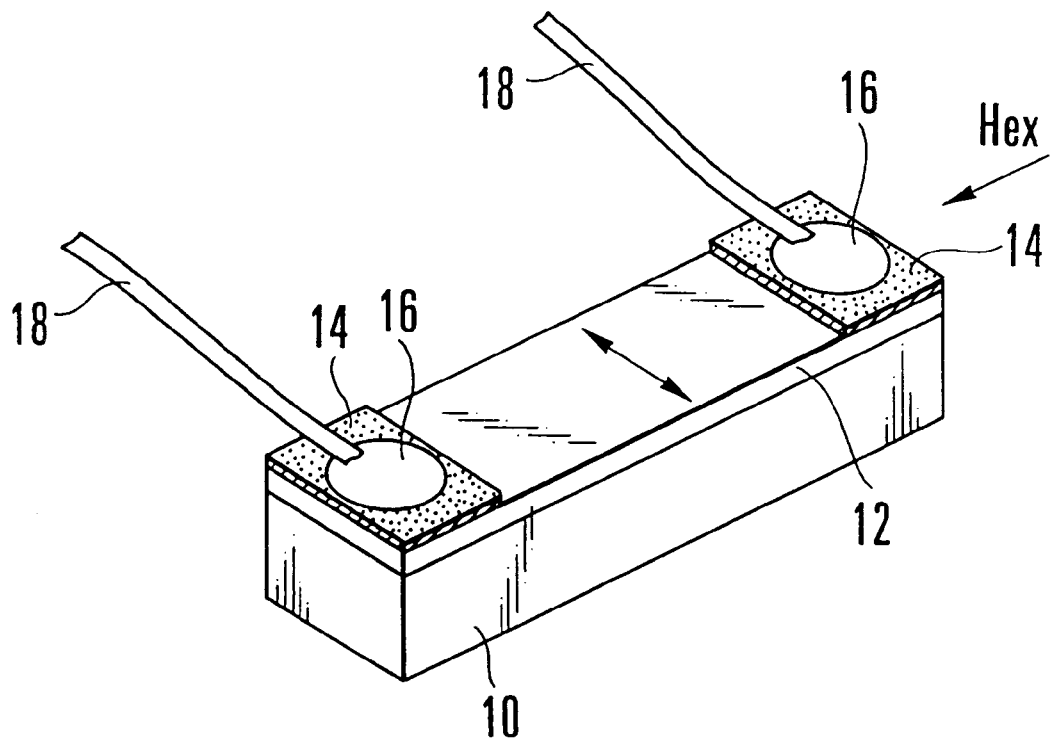
FIG. 3 is a perspective view showing the structure of the first embodiment.

FIG. 3 shows the structure of the first embodiment of a magnetic detecting element utilizing an MI effect.

In the arrangement of the magnetic detecting element of this embodiment, a high-permeability magnetic film 12 is formed on the entire upper surface of a non-magnetic substrate 10 having a narrow rectangular shape, conductive films 14 are formed on both the end portions in the longitudinal direction of the non-magnetic substrate 10, and a wire 18 is connected to each of the conductive films 14 with a solder 16 for external connection.

The non-magnetic substrate 10 is made of a calcium titanate (Ti—Ca based ceramic), oxide glass, titania, alumina or the like.

Referring to FIG. 3, an arrow Hex is a magnetic field detection direction in which an external magnetic field to be detected is applied to the magnetic detecting element. The longitudinal direction of the non-magnetic substrate 10, i.e., the longitudinal-direction of the rectangular high-permeability magnetic film 12 corresponding to the non-magnetic substrate 10 is along the magnetic field detection direction. In addition, the magnetic film 12 has magnetic anisotropy such that, as indicated by a bi-directional arrow in FIG. 3, an easy direction of magnetization is perpendicular to the longitudinal direction of the magnetic film 12 in its plane, i.e., is perpendicular to the magnetic field detection direction.

In this arrangement, a high-frequency drive current is applied to the high-permeability magnetic film 12 from both end portions thereof in the longitudinal direction through the wires 18 and the conductive films 14, and a change in impedance generated by an external magnetic field between both the end portions of the high-permeability magnetic film 12 in the longitudinal direction is converted into an electric signal, thereby obtaining an output.

The MI characteristics of the magnetic detecting element depend on the permeability and thickness of the high-permeability magnetic material constituting the magnetic film 12. Test performed for examining the material and thickness and the result of the test will be described below.

In order to examine the relationship between a permeability and MI characteristics, a plurality of samples of the magnetic film 12 which had different permeabilities in the longitudinal direction were prepared, and the relationship between permeabilities in the longitudinal direction at 1 MHz and the MI characteristics were examined. The dimensions of each sample were set to be a width W=0.2 mm, a thickness t=5 μm, and a length L=4 mm, an external magnetic field of about ±10 [Oe] which was changed by a Helmholtz coil was applied, and the maximum amount of change in impedance was measured.

Figure 4:
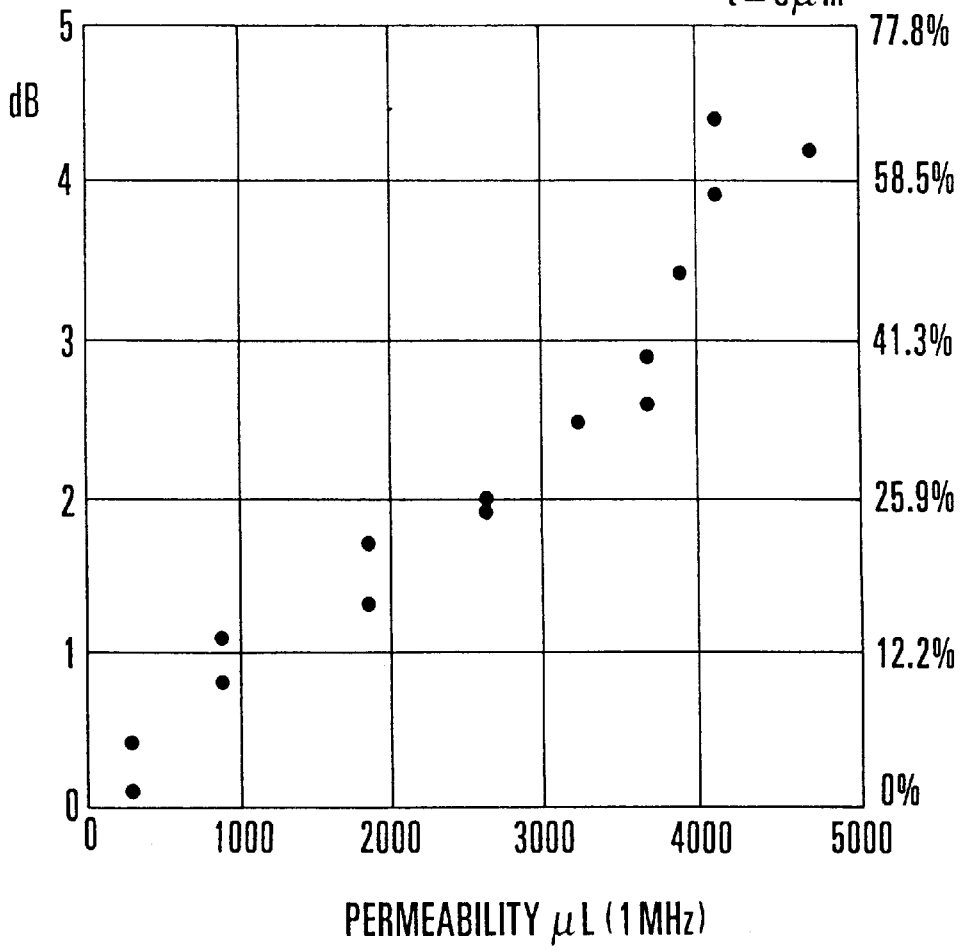
FIG. 4 is a graph showing the relationship between the permeability of a high-permeability magnetic film of the first embodiment and the maximum amount of change in impedance.

The obtained result is shown in FIG. 4. As is apparent from FIG. 4, the permeability in the longitudinal direction correlates with the maximum amount of change in impedance. Assume that the maximum amount of change in impedance is set to be a value of 25% (about 2 dB) or more which is equal to or higher than that of an amorphous wire. In this case, as is apparent from the graph, a permeability of 2500 or more is required. In order to obtain this value, a microcrystalline film which has a permeability higher than that of a crystalline magnetic film such as a sendust and consists of an Fe—Co—B based amorphous film, an Fe—N based film, or an Fe—C based film is suitably used as the magnetic film 12. Such a magnetic film can be formed by a vacuum film formation technique such as sputtering.

MI characteristics depending on a film thickness were measured by using an Fe—Ta—C based microcrystalline film. The permeability in the longitudinal direction of the magnetic film is 4100 at 1 MHz. Three samples respectively having thicknesses of 2 μm, 5 μm, and 8 μm were prepared, and an amount of change in impedance of each sample was measured in such a manner that an external magnetic field was changed by about ±10 [Oe] by a 100-MHz drive current.

Figure 5:
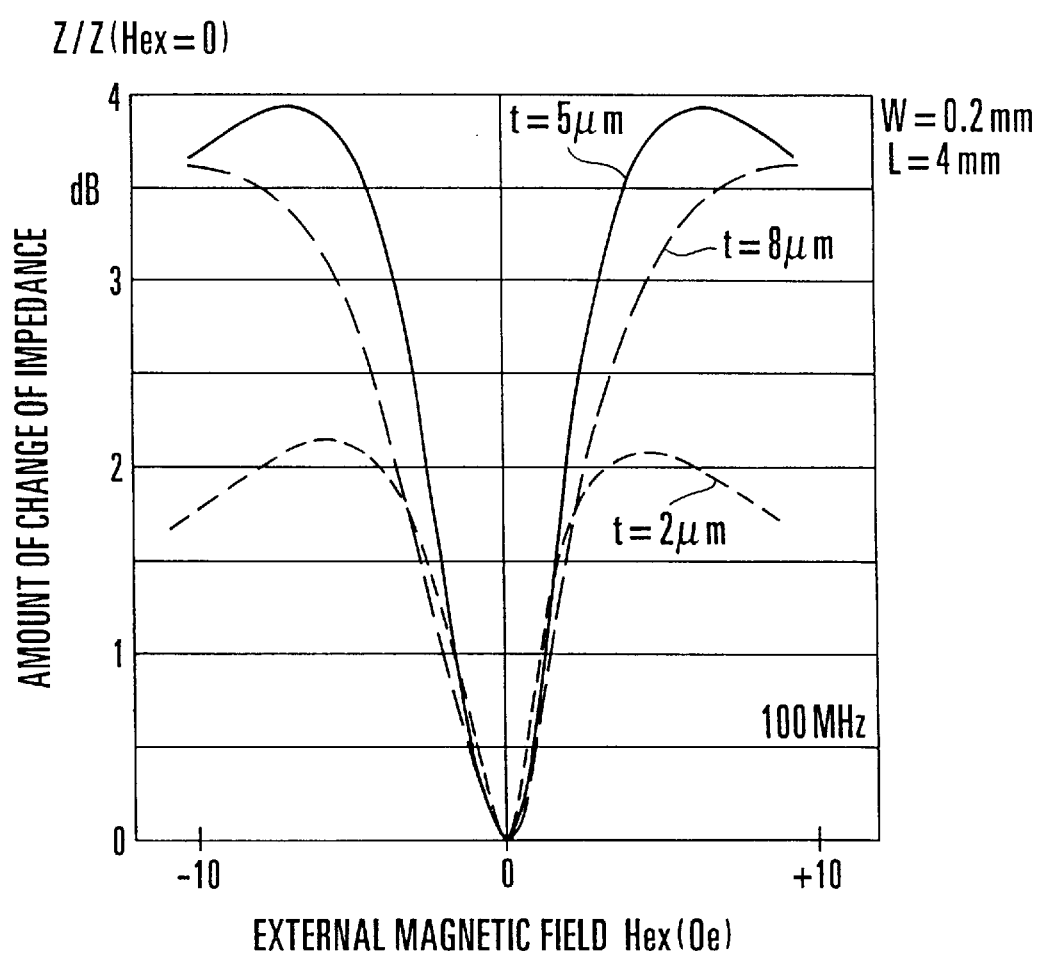
FIG. 5 is a graph showing the relationship between the film thickness of the high-permeability magnetic film of the first embodiment and an amount of change in impedance.

The obtained result is shown in FIG. 5. As is apparent from FIG. 5, the peak value obtained when the film thickness t is 2 μm is smaller than that obtained when the film thickness t is 5 μm, and the change in impedance begins to be moderated when the film thickness t is 8 μm because the peak is shifted outward. As is apparent from the test result, the optimum range is a range of 3 μm to 8 μm. However, this range need not be limited to a specific range when the element is used in such a manner that a low peak or a decrease in inclination does not influence the element.

As described above, the magnetic film 12 preferably consists of a microcrystalline film such as an Fe—Co—B based amorphous film, an Fe—N based film, or an Fe—C based film in which the permeability in the longitudinal direction is 2500 or more at 1 MHz, and preferably has a thickness of 3 μm to 8 μm. In this manner, a small-sized, high-sensitivity magnetic detecting element which can obtain an MI effect higher than that of an amorphous wire can be provided.

[Second Embodiment]

According to the first embodiment, as in an amorphous wire, the resistance component and inductance component of an impedance change in accordance with a change in permeability caused by an external magnetic field. However, when the magnetic detecting element is used with an oscillator, it is preferable that there occurs no change in resistance component.

The second embodiment of the present invention which is arranged in such a manner will be described below with reference to FIG. 6.

Figure 6:
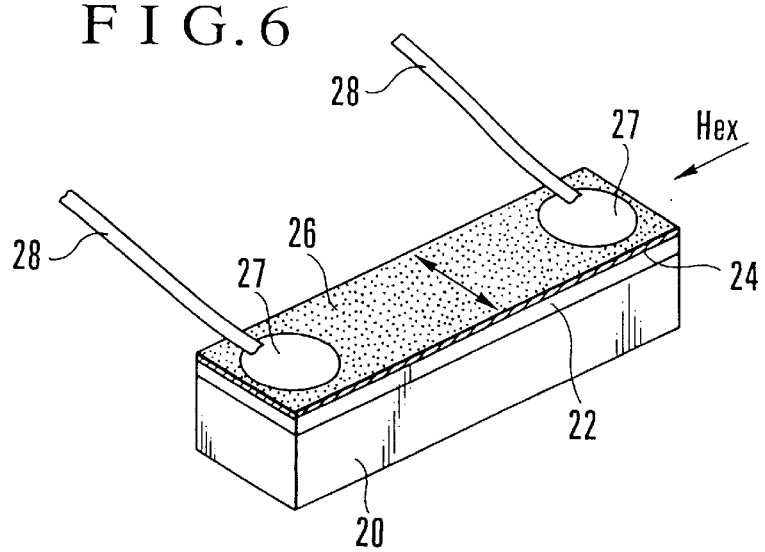
FIG. 6 is a perspective view showing the structure of the second embodiment.

In the arrangement of a magnetic detecting element according to the second embodiment shown in FIG. 6, a high-permeability magnetic film 22 is formed on the entire upper surface of a rectangular non-magnetic substrate 20, an insulating film 24 is stacked on the high-permeability magnetic film 22, and a conductive film 26 is formed on the insulating film 24. External connecting wires 28 are connected to both the end portions of the conductive film 26 in the longitudinal direction with a solder 27. As in the first embodiment, the longitudinal direction of the magnetic detecting element is arranged along a detection direction of an external magnetic field.

In the details of the second embodiment, the non-magnetic substrate 20 is, as in the first embodiment, made of a calcium titanate (Ti—Ca based ceramic), oxide glass, titania, alumina or the like.

The magnetic film 22 consists of a microcrystalline film such as an Fe—Co—B based amorphous film, an Fe—N based film, or an Fe—C based film which are described in the first embodiment, and is formed by a vacuum film formation technique such as sputtering. As in the first embodiment, the magnetic film 22 has magnetic anisotropy such that, as indicated by a bi-directional arrow in FIG. 6, an easy direction of magnetization is perpendicular to the longitudinal direction of the magnetic film 22 in its plane. This anisotropy can be obtained by cooling the magnetic film in a magnetic field after film formation.

The insulating film 24 is an oxide insulating film consisting of $SiO_2$, $Cr_2O_3$, $TiO_2$, or the like, and is formed by a vacuum film formation technique or the like. Its thickness preferably has a lower limit of 0.05 μm at which an insulating effect can be obtained, and preferably has an upper limit of 1 μm or less so that the value of an inductance generated by the conductive film 26 and the high-permeability magnetic film 22 does not decrease.

In addition, the conductive film 26 on the insulating film 24 is made of a metal such as Cu or Au having a low resistivity.

In the above arrangement, in magnetic detection, a high-frequency drive current is applied from both the end portions to the conductive film 26 in the longitudinal direction through the wires 28. Unlike the case where a current directly flows in the magnetic film as in the first embodiment, a magnetic flux generated by the drive current passes through the section of the high-permeability magnetic film 22 without being refluxed in the section. However, since the direction of the magnetic flux is along the easy direction of magnetization of the high-permeability magnetic film 22, a mechanism of a change in inductance is not lost, and a change in impedance occurs in each of both the end portions of the conductive film 26 in the longitudinal direction due to an external magnetic field. As a matter of course, the influence of a skin effect caused by an eddy current does not occur because no current flows in the high-permeability magnetic film 22. Therefore, a resistance component rarely changes.

Actual data of the characteristics of the magnetic detecting element according to this embodiment will be described below.

A sample of the first embodiment in which an Fe—Ta—C based microcrystalline film was used as a high-permeability magnetic film, dimensions were set to be a thickness of 5 μm, a width of 0.2 mm, and a length of 4 mm and a drive current directly flows in the magnetic film was compared with a sample of the second embodiment in which a Cu conductive film having a thickness of 1 μm was formed on a magnetic film through an insulating film made of $Cr_2O_3$ and having a thickness of 0.1 μm. As measurement conditions, a 100-MHz drive current flows in each sample, and amounts of change in impedance with respect to an external magnetic field are compared with each other. The comparison result is shown in Table 1 described below.

TABLE 1

| Drive Current | R Component | L Component | Q | ΔZ/Z |
|---|---|---|---|---|
| Apply to Magnetic Film | 10 Ω | 16 nH | 1.0 | 52% |
| Apply to Conductive Film | 1.5 Ω | 14 nH | 5.9 | 48% |

As is apparent from the result in Table 1, when a conductive film is formed on the magnetic film through the insulating film and a drive current flows in the conductive film, while an amount of change in impedance ΔZ/Z is kept by keeping an inductance L component, a resistance R component can be considerably decreased, and a high Q value can be obtained.

In addition, in this embodiment, since no drive current flows in the high-permeability magnetic film 22, current leakage from the magnetic film 22 to an external circuit need not be a concern, the magnetic film 22 can be brought into contact with a magnetic recording medium or an adhered magnetic medium without any trouble, and any special device is not required in the structure.

As a modification of this embodiment, a multilayered film is formed by alternately stacking a plurality of magnetic films 22 and insulating films. In this case, the effect of this embodiment can be further improved.

In the arrangement of this embodiment, when the electric resistivity of the high-permeability magnetic film 22 is set to be considerably higher than that of the conductive film 26, e.g., 100 μΩ·cm or more, the insulating film 24 becomes unnecessary and can be omitted. When the conductive film 26 is made of, e.g., Cu, its resistivity is 2 μΩ·cm. In contrast to this, when the resistivity of the high-permeability magnetic film 22 is set to be 100 μΩ·cm or more, the resistivity of the high-permeability magnetic film 22 is 50 or more times the resistivity of the conductive film 26. When a drive current is applied to the conductive film 26, almost all drive current flows in the conductive film 26 without the insulating film 24, and the drive current only slightly flows in the high-permeability magnetic film 22. Therefore, an effect which is almost the same as described above can be obtained.

[Third Embodiment]

In the second embodiment, although an inductance is generated by the conductive film 26 and the high-permeability magnetic film 22, since the magnetic path of the high-permeability magnetic film 22 is opened to the magnetic field generated by the drive current, an inductance is low and cannot be easily handled on the circuit. The arrangement of the third embodiment made in consideration of this point is shown in FIG. 7.

Figure 7:
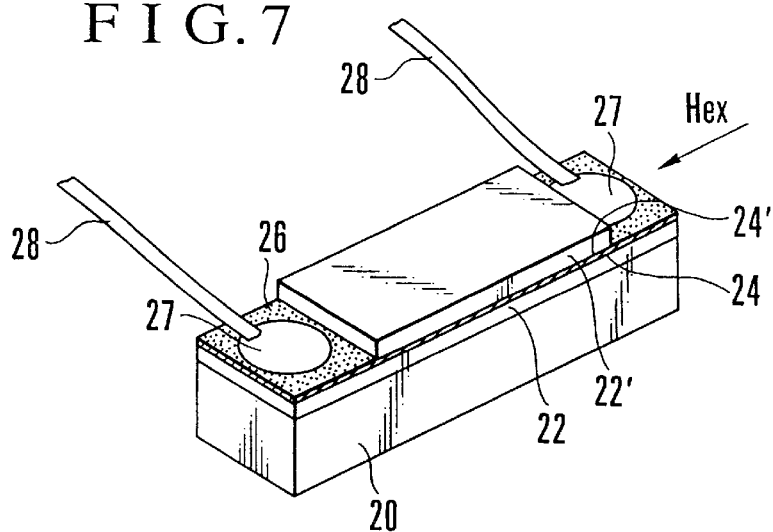
FIG. 7 is a perspective view showing the structure of the third embodiment.

In the arrangement in FIG. 7, on the same structure as that of the second embodiment in which the high-permeability magnetic film 22, the insulating film 24, and the conductive film 26 are stacked in this order on the non-magnetic substrate 20, an insulating film 24' is formed on the intermediate portion except for both the end portions where the wires 28 are connected to the conductive film 26 with the solder 27. In addition, a high-permeability magnetic film 22' is stacked on the insulating film 24'. Like the magnetic film 22, the magnetic film 22' has magnetic anisotropy such that an easy direction of magnetization is perpendicular to the longitudinal direction of the magnetic film 22' in its plane. As in the first and second embodiments, the entire structure is arranged to have a longitudinal direction along a detection direction of an external magnetic field.

In this arrangement, the high-permeability magnetic films 22 and 22' are formed on the upper and lower surfaces of the conductive film 26, the magnetic path of a magnetic material in which a flux generated by applying a drive current flows can be a closed magnetic path.

The thicknesses of the insulating films 24 and 24' fall within the range from 0.05 μm to 1 μm as in the second embodiment. The total thickness of the conductive film 26 and upper and lower insulating films 24 and 24' corresponds to a magnetic gap between the two upper and lower high-permeability magnetic films 22 and 22', must be set to be small as possible to increase an inductance, and properly set to be about 0.2 μm to 3 μm.

Actual data of the characteristics of the magnetic detecting element of this embodiment will be described below.

The element of this embodiment was constituted under the following conditions. That is, Fe—Ta—C based microcrystalline magnetic films were used as the high-permeability magnetic films 22 and 22', the dimensions of the upper magnetic film 22' were set to be a thickness of 5 μm, a width of 0.2 mm, and a length of 3 mm, and the dimensions of the lower magnetic film 22 were set to be a thickness of 5 μm, a width of 0.2 mm, and a length of 4 mm. Each of the insulating films 24 and 24' was made of $Cr_2O_3$, and had a thickness of 0.1 μm. The conductive film 26 was made of Cu and had a thickness of 0.5 μm. A result obtained by examining the characteristics by using a 100-MHz drive current is shown in Table 2 described below.

TABLE 2

| R Component | L Component | Q | ΔZ/Z |
|---|---|---|---|
| 2.5 Ω | 29 nH | 7.3 | 59% |

As is apparent from Table 2, according to this embodiment, an inductance L which is twice that of the second embodiment can be obtained, the amount of change in impedance ΔZ/Z increases, and the Q value increases.

In this embodiment, as in the second embodiment, the electric resistivities of the high-permeability magnetic films 22 and 22' may be set to be considerably higher than that of the conductive film 26, e.g., 100 μΩ·cm or more, to omit the insulating films 24 and 24'.

Figure 8:
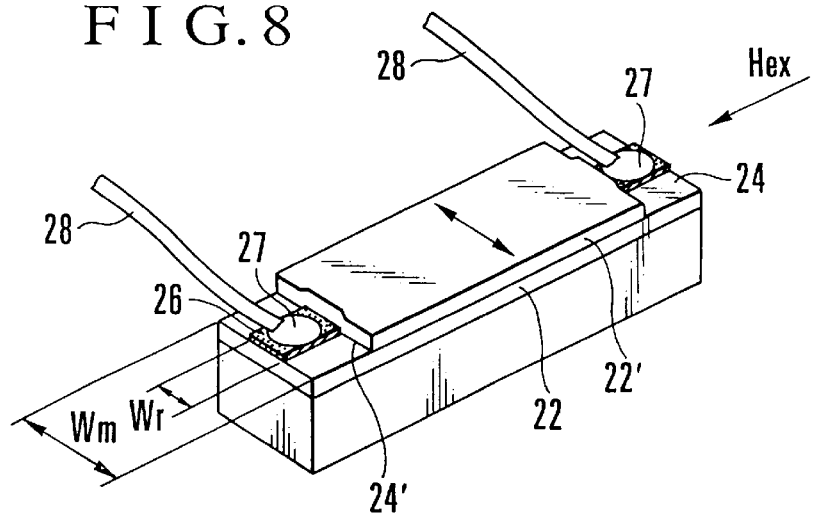
FIG. 8 is a perspective view showing the structure of a modification of the third embodiment.

As a modification of this embodiment, as shown in FIG. 8, if a width Wr in a direction perpendicular to the longitudinal direction of the conductive film 26 in its plane is made smaller than a width Wm of the high-permeability magnetic films 22 and 22' in the same direction, both the end portions of the upper and lower magnetic films 22 and 22' in the direction of the width Wm become close to each other, so that the magnetic films 22 and 22' constitute an almost complete closed magnetic path. For this reason, the impedance can be further increased. In this case, if the insulating films 24 and 24' are omitted as described above, the high-permeability magnetic films 22 and 22' constitute a complete closed magnetic path, and the inductance can be increased.

In this embodiment, when a plurality of magnetic films 22 and 22' and insulating films are alternately stacked, the effect will be further improved.

According the embodiment described above, according to the first arrangement in which an almost rectangular high-permeability magnetic film is formed on a non-magnetic substrate, the second arrangement in which an almost rectangular high-permeability magnetic film, ah insulating film, and a conductive film are stacked as layers in order from below, the third arrangement in which an insulating film and a high-permeability magnetic film are stacked, as layers in order from below, on the conductive film of the second arrangement, or the fourth and fifth arrangements in which the electric resistivities of the high-permeability magnetic films in the second and third arrangements are set to be considerably higher than that of the conductive film to omit the insulating films, magnetic detection utilizing the MI effect can be obtained. When the materials and thicknesses of the respective films are selected, performance higher than that of an element constituted by an amorphous wire can be obtained. In addition, the thickness, width, and length of each film can be freely selected, and the magnetic detecting element can be easily handled and is suitable for miniaturization.

In the first arrangement, the resistance component and inductance component of the impedance change by the external magnetic field. In the second and third embodiments, the resistance component can be decreased while keeping the inductance component. In the third embodiment, an inductance higher than that of the second arrangement can be obtained. In the fourth and fifth arrangements, an excellent effect which is almost the same as that of the second and third arrangements can be obtained by a simple arrangement in which an insulating film is omitted.

In the above embodiments, the arrangement in which a rectangular high-permeability magnetic film is formed on a non-magnetic substrate has been described. Subsequently, in each of the following embodiments, an arrangement in which a high-permeability magnetic film having a zigzag shape is formed on a non-magnetic substrate.

[Fourth Embodiment]

Figure 9:
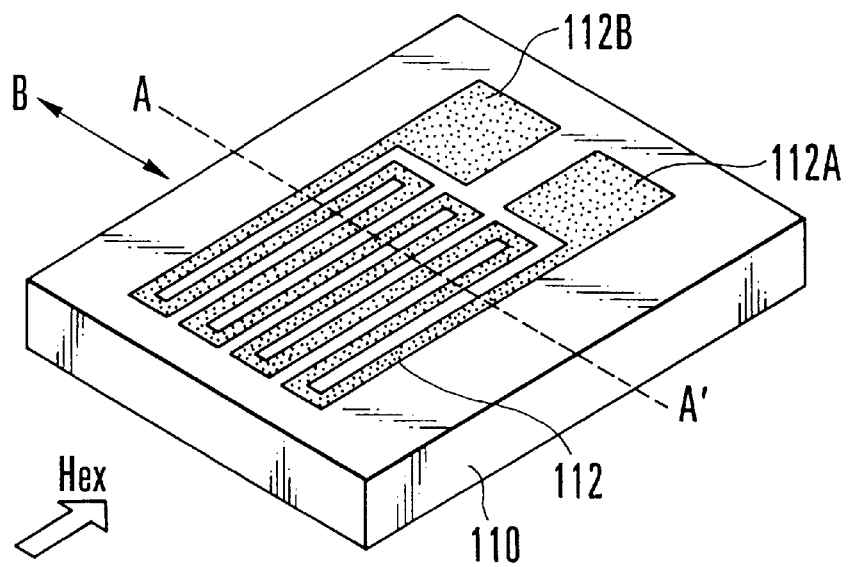
FIG. 9 is a perspective view showing the structure of a magnetic detecting element according to the fourth embodiment.
Figure 10:
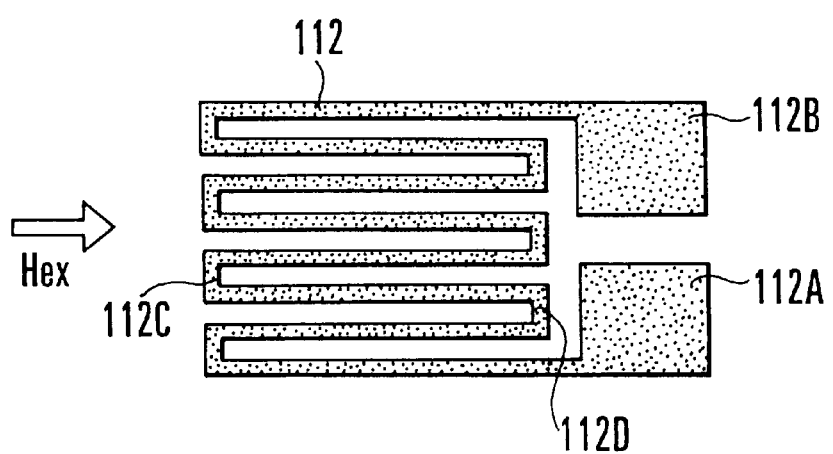
FIG. 10 is a plan view showing the zigzag pattern of the high-permeability magnetic film of the main body of the magnetic detecting element.
Figure 11:
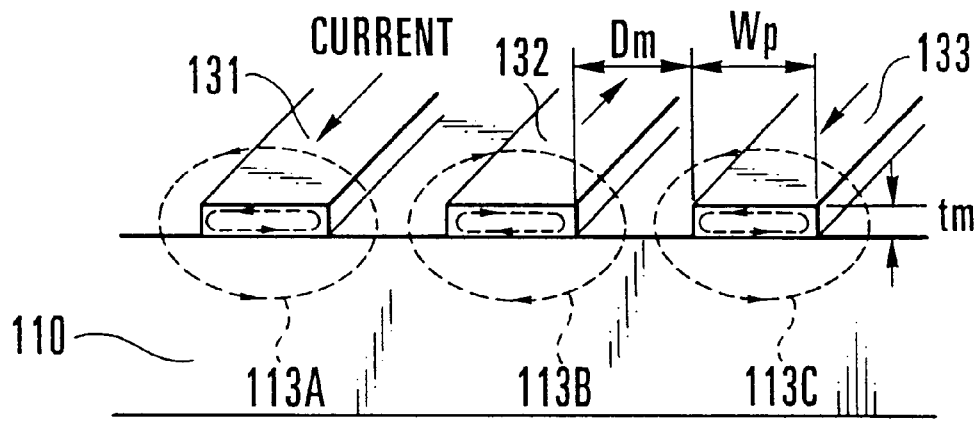
FIG. 11 a view for explaining a current and a magnetic field in a straight portion of the zigzag pattern when the magnetic detecting element is driven.

FIGS. 9 to 11 explain an embodiment of a magnetic detecting element utilizing the MI effect as the fourth embodiment. FIG. 9 shows the entire structure of the magnetic detecting element.

Referring to FIG. 9, reference numeral 110 denotes a non-magnetic substrate which is, as in the embodiment described above, made of a calcium titanate (Ti—Ca based ceramic), oxide glass, titania, alumina, or the like.

A high-permeability magnetic film (to be referred to as a magnetic film hereinafter) 112 having a zigzag pattern and serving as a magnetic detecting element main body is formed on the upper surface of the non-magnetic substrate 110, as a magnetic film such as an Fe—Co—B based amorphous, Fe—C based or Fe—N based microcrystalline film by a vacuum film formation technique. If the thickness of the magnetic film 112 is too small, the MI effect degrades. If the thickness of the magnetic film 112 is too large, the impedance decreases. For this reason, the thickness of the magnetic film 112 is preferably set within the range of 1 μm to 20 μm.

In the zigzag pattern of the magnetic film 112, as shown in FIG. 10, a plurality of straight portions each having a predetermined length and arranged along a magnetic field detection direction in which an external magnetic field Hex to be detected is applied are arranged in parallel at predetermined intervals, the end portions of the straight portions which are adjacent to each other to be sequentially folded are vertically bent as folded portions 112C and 112D to be connected to each other, and those portions are electrically connected in series with each other. Rectangular terminal portions 112A and 112B are formed at both the ends of the zigzag pattern. As in the first embodiment, conductive films are stacked on the terminal portions 112A and 112B, respectively, and external wires are soldered on the conductive films.

The magnetic film 112 is provided with a magnetic anisotropy by cooling in a magnetic field after film formation such that an easy direction of magnetization becomes a direction of an arrow B in FIG. 9, which is a direction perpendicular to the magnetic field detection direction in which the external magnetic field Hex is applied in the plane of the magnetic film 112.

In such an arrangement, when the external magnetic field Hex is to be detected, a high-frequency current is applied from both the terminal portions 112A and 112B to the magnetic film 112. The impedance between the terminal portions 112A and 112B changes depending on the intensity of the external magnetic field Hex, and this change is converted into an electric signal to obtain an output.

In the zigzag pattern of the magnetic film 112, as shown in FIG. 11 which is a sectional view taken along an A–A' line in FIG. 9, currents flowing in adjacent pattern straight portions 131, 132, and 133 are alternately reversed as indicated by solid arrows in FIG. 11, and magnetic fields generated around the pattern straight portions are indicated by broken arrows represented by reference numerals 113A to 113C. The magnetic fields form a magnetic reflux within the magnetic film 112 to generate the inductance of the magnetic detecting element. Even if the interval Dm between the adjacent pattern straight portions is decreased, an adverse influence such as interference among the magnetic fields 113A to 113C rarely occurs. For this reason, the width Wp and thickness tm of each pattern straight portion can be freely selected to obtain a predetermined inductance.

Since the zigzag pattern is used to decrease the sectional area, an inductance per unit volume increases, and the total length of the magnetic film 112 can be increased by the zigzag pattern. Therefore, even if the length of the element main body is small in the magnetic field detection direction, a large inductance can be obtained, and the absolute value of the impedance can be increased. In addition, the length of the element main body can be set to be almost equal to that of an MR element, and an excellent MI effect can be obtained with micro-magnetization.

A result obtained by examining a sample of the magnetic detecting element of this embodiment will be described below. An Fe—Ta—C based magnetic film was used as the magnetic film 112, the number of times of folding was set to be 7, the width and thickness of each pattern straight portion were respectively set to be 10 μm and 5 μm, the interval between adjacent pattern straight portions was set to be 10 μm, and the length of each pattern straight portion was set to be 0.2 mm. In order to measure the impedance, a 100-MHz high-frequency current was made to flow from both the ends of the magnetic film 112, and changes in voltage at both the ends were examined. An external magnetic field was applied by a Helmholtz coil and was made to change within the range of ±25 [Oe].

As a result, an inductance L at 100 MHz was 58 nH, and a Q value obtained at this time was 5.5. In contrast to this, when a conventional Fe—Co—B based amorphous wire having a diameter of 30 μm was used, an inductance L was 45 nH per 1 mm, a Q value was 5.8. Although the length of the magnetic detecting element of this embodiment was small, i.e., 0.2 mm, the inductance L and the Q value were large. An amount of change in impedance of the magnetic detecting element of this embodiment was a preferable change of 62% at the external magnetic field Hex=8 [Oe].

In this manner, the magnetic detecting element of this embodiment can stably obtain a high output. In addition, since the element main body consists of a magnetic film, the element can be easily handled without any problem unlike an amorphous wire. The element can be easily manufactured, and multiple formation in which a large number of elements are made from one block at once can be performed. Therefore, the element can be manufactured at low cost.

[Fifth Embodiment]

Figure 12:
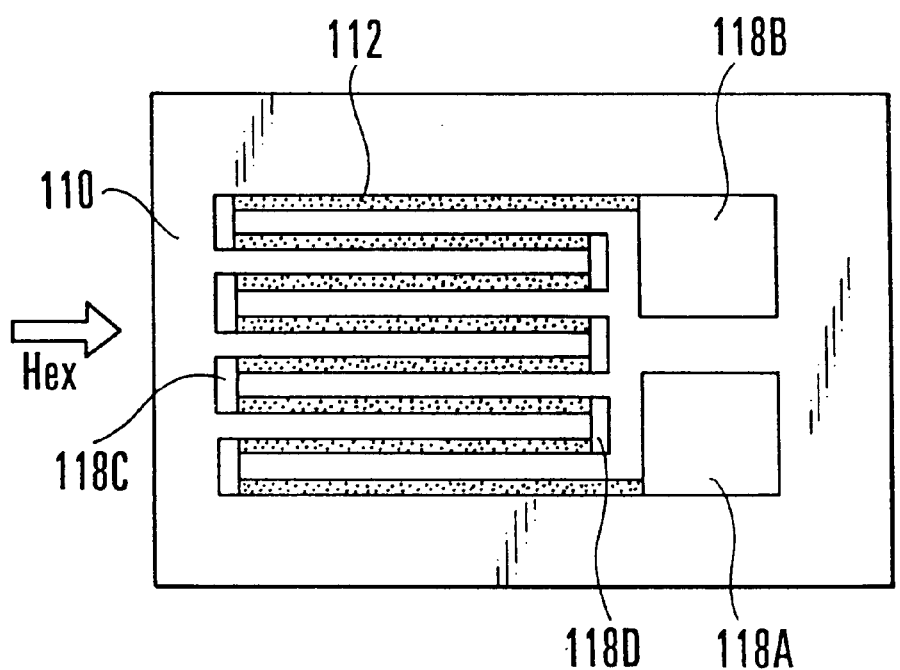
FIG. 12 is a plan view showing the structure of a magnetic detecting element according to the fifth embodiment.

FIG. 12 shows the structure of a magnetic detecting element according to the fifth embodiment. In this embodiment, as in the fourth embodiment, a magnetic film 112 having a zigzag pattern is formed on a non-magnetic substrate 110, and conductive films 118A to 118D made of a Cu or Au film are formed on the terminal portions 112A and 112B and folded portions 112C and 112D of the magnetic film 112.

With the above structure, the magnetic impedance effects of the terminal portions 112A and 112B and the folded portions 112C and 112D can be eliminated by the conductive films 118A to 118D. The magnetic detecting function of only the pattern straight portions along a magnetic field detection direction in which the external magnetic field Hex is applied is used to faithfully derive the magnetic impedance effect in the magnetic field detection direction, so that detection sensitivity can be improved.

[Sixth Embodiment]

Figure 13:
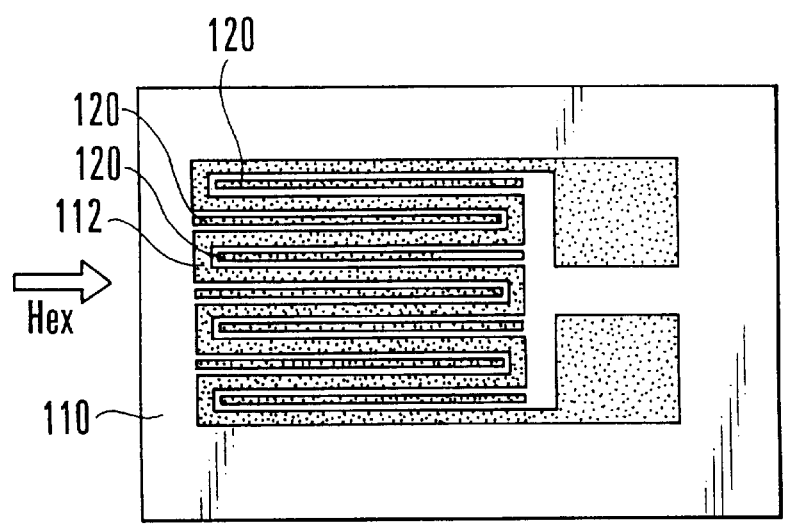
FIG. 13 is a plan view showing the structure of a magnetic detecting element according to the sixth embodiment.

FIG. 13 shows the structure of a magnetic detecting element according to the sixth embodiment. In this embodiment, as in the fourth embodiment, a magnetic film 112 having a zigzag pattern is formed on a non-magnetic substrate 110, and straight high-permeability magnetic films 120 are formed on the gaps of the zigzag pattern, respectively.

With the above structure, the magnetic resistance of the entire element main body in a direction of application of an external magnetic field Hex can be decreased, and the detection sensitivity of the external magnetic field Hex can be improved. Note that the structure of this embodiment in which the straight magnetic films 120 are arranged on the gaps of the zigzag pattern may be applied to the structure of the fifth embodiment.

[Seventh Embodiment]

As the seventh embodiment, an embodiment in which the arrangement of the fourth embodiment is changed into a reproducing magnetic head will be described below with reference to FIGS. 14 to 18.

Figure 14:
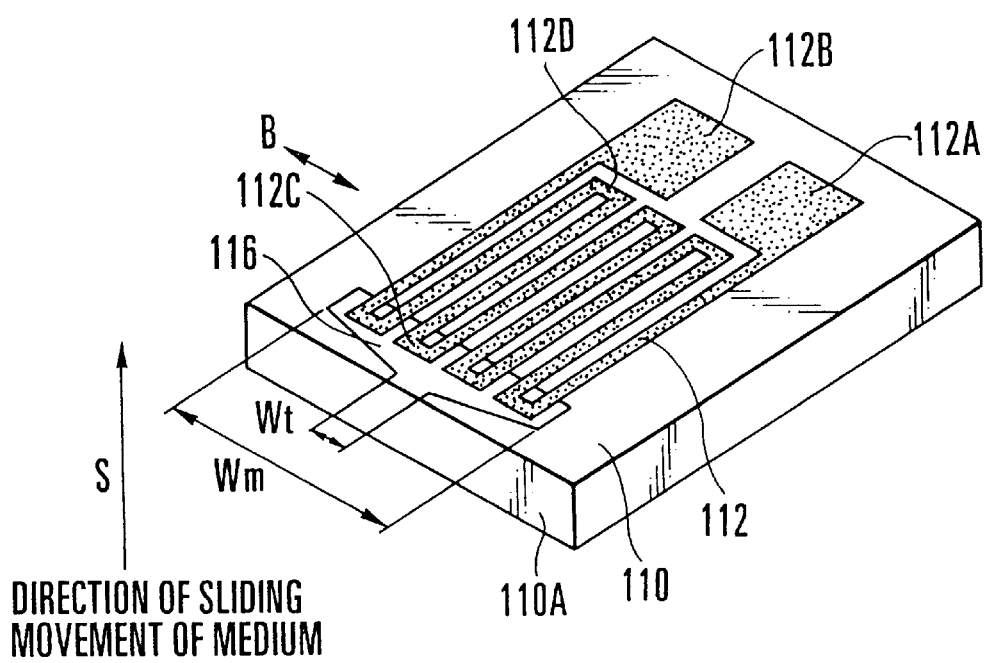
FIG. 14 is a perspective view showing the structure of a magnetic head according to the seventh embodiment.
Figure 15:
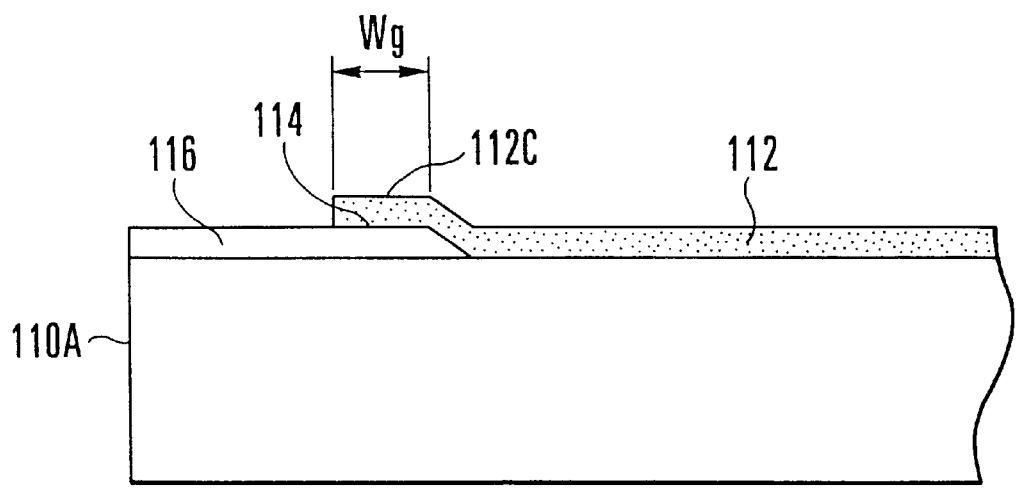
FIG. 15 is a sectional view showing an end portion of the magnetic head on the medium sliding surface side.

In the arrangement of the magnetic head shown in FIGS. 14 and 15, an end surface 110A of a non-magnetic substrate 110 is formed as a medium sliding surface on which a magnetic recording medium (not shown) slides in the upward direction indicated by an arrow S in FIG. 14. A magnetic film 112 having the zigzag pattern described above is formed as a first high-permeability magnetic film on a surface perpendicular to the medium sliding surface 110A of the non-magnetic substrate 110 such that the magnetic film 112 is at a distance from the medium sliding surface 110A. The direction of the zigzag pattern of the magnetic film 112 is set such that a plurality of pattern straight portions which are arranged in parallel at predetermined intervals are perpendicular to the medium sliding surface 110A. The magnetic film 112 has magnetic anisotropy such that an easy direction of magnetization is parallel to the medium sliding surface 110A in its plane as indicated by an arrow B in FIG. 14.

A second high-permeability magnetic film 116 is formed, through an insulating film 114 made of an oxide such as $SiO_2$ or $Cr_2O_3$, under a folded portion 112C of the zigzag pattern of the magnetic film 112 on the side of the medium sliding surface 110A such that the magnetic film 112 and the magnetic film 116 overlap each other. The magnetic film 116 is magnetically connected to the magnetic film 112 and is electrically insulated therefrom by the insulating film 114. The magnetic film 116 extends from the lower portion of the folded portion 112C up to the edge of the medium sliding surface 110A, and is formed such that an end of the magnetic film 116 is exposed to the medium sliding surface 110A. A magnetic recording medium (not shown) slides in the upward direction in FIG. 14 which is perpendicular to the plane of the magnetic film 116.

The magnetic film 116 is used to guide the magnetic field of recording magnetization of the magnetic recording medium to the magnetic film 112. As the magnetic film 116, a sendust, permalloy, amorphous, Fe—N based or Fe—C based microcrystalline film or the like is used. A thickness tg of the end portion of the magnetic film 116 exposed to the medium sliding surface 110A corresponds to the gap width of the magnetic gap of an induction type magnetic head. Although a width Wt of the end portion of the magnetic film 116 serves as a track width, the width Wt is made smaller than a width Wm of the connection portion overlapping the first magnetic film 112.

A width Wg of the connection portion where the first and second magnetic films 112 and 116 shown in the sectional view of FIG. 15 overlap each other is determined such that the magnetic resistance of the gap of the connection portion does not decrease and that an unnecessary impedance is not generated by the folded portion 112C of the magnetic film 112. The width Wg is, therefore, selected within the range of 0 to 100 $\mu$m.

Note that the magnetic film 116 is formed under the folded portion 112C of the magnetic film 112 in FIGS. 14 and 15. However, even if the magnetic film 116 is formed over the folded portion 112C, the same function as described above can be obtained.

The thickness of the insulating film 114 between the magnetic films 112 and 116 preferably has a lower limit of 0.05 $\mu$m at which an insulating effect can be obtained, and preferably has an upper limit of 1 $\mu$m at which the magnetic resistance of the connection portion of the magnetic films 112 and 116 does not increase.

With the above arrangement, in a reproducing operation, the magnetic recording medium (not shown) slides over the medium sliding surface 110A, and a high-frequency current is applied from terminal portions 112A and 112B of both the ends to the magnetic film 112. The magnetic field of recording magnetization of the magnetic recording medium is applied to the first magnetic film 112 through the second magnetic film 116, and the magnetic field changes the impedance between the terminal portions 112A and 112B of the magnetic film 112. This change is converted into an electric signal to obtain a reproduction output.

Figure 18:
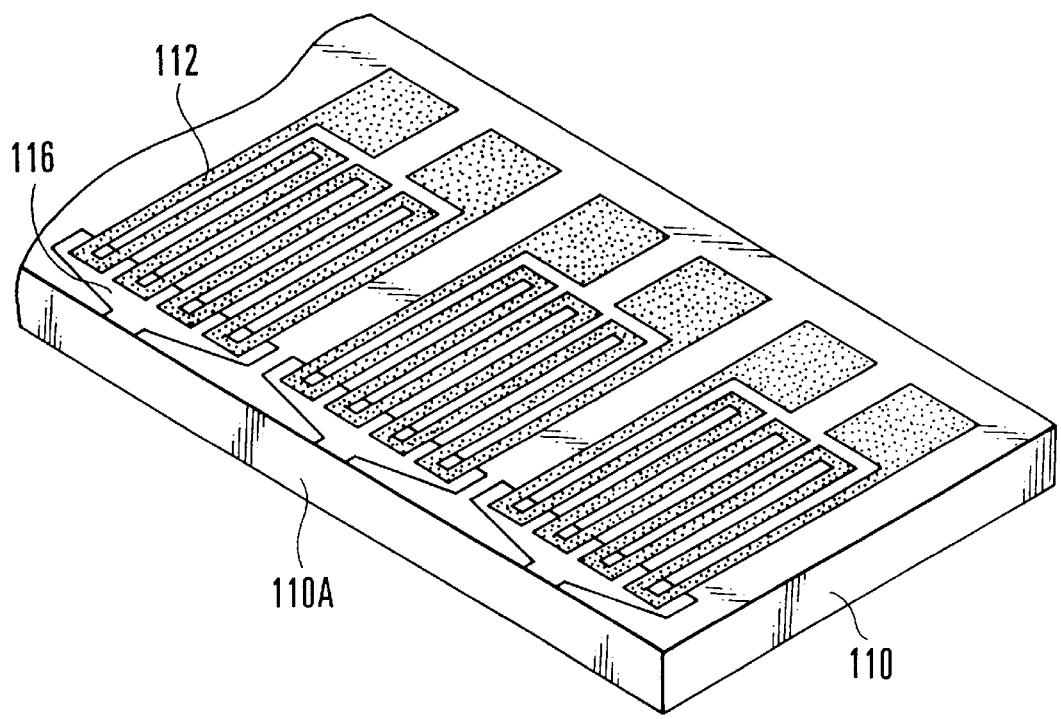
FIG. 18 is a perspective view showing the magnetic head which is multi-tracked.

The magnetic head of this embodiment can obtain high sensitivity and high impedance by the same effect as in the first embodiment, and can obtain a stable, high reproduction output. As in the first embodiment, the magnetic head can be easily manufactured, and multiple formations can be made (FIG. 18).

Note that the second magnetic film 116 exposed to the medium sliding surface 110A is insulated from the first magnetic film 112 by the insulating film 114. For this reason, the high-frequency current applied to the magnetic film 112 does not flow into the medium through the magnetic film 116.

Figure 16:
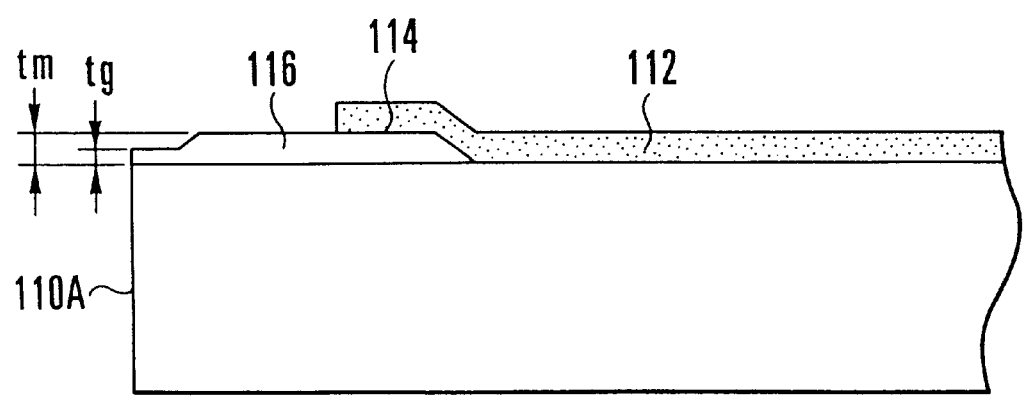
FIG. 16 is a sectional view of the magnetic head when the thickness of an end portion of a second high-permeability magnetic film exposed to a medium sliding surface in the magnetic head is decreased.

In the magnetic head of this embodiment, a track width can be desirably set by setting the width Wt of the end of the magnetic film 116 exposed to the medium sliding surface 110A. In addition, the thickness tg of the end portion of the magnetic film 116 exposed to the medium sliding surface 110A and corresponding to the gap width of an induction type magnetic head can be desirably set. For example, as shown in FIG. 16, if the thickness tg of the end portion of the magnetic film 116 exposed to the medium sliding surface 110A is made smaller than the thickness tm of the remaining portion overlapping the magnetic film 112 to decrease the thickness corresponding to the gap width, a shaping loss for micro-magnetization can be improved.

Figure 17:
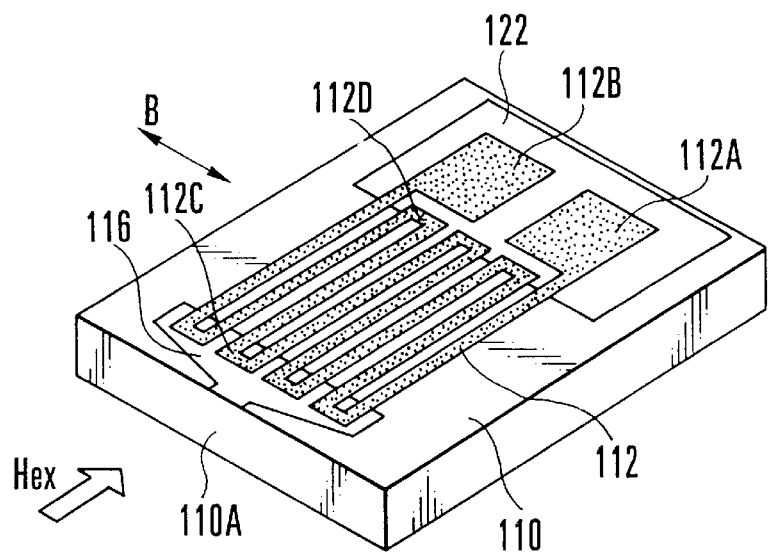
FIG. 17 is a perspective view showing modification of the magnetic head.

When the length of the pattern straight portions of the first magnetic film 112 perpendicular to the medium sliding surface 110A is short, a diamagnetic field in the magnetic film 112 increases, so that the sensitivity may be degraded. In this case, as shown in FIG. 17, if a third high-permeability magnetic film 122 is formed under the folded portion 112D of the magnetic film 112 opposite to the medium sliding surface and the terminal portions 112A and 112B through an insulating film (not shown) to extend in the direction opposite to the medium sliding surface, the sensitivity can be improved.

In addition, if a plurality of element main bodies each constituted by the first magnetic film 112, the second magnetic film 116, and the insulating film 114 are arranged on the surface of the non-magnetic substrate 110 as shown in FIG. 18, a multi-track head can be easily constituted. In this case, since the opposite areas of adjacent element main bodies are very small, crosstalk can be prevented.

According to the magnetic detecting elements in the fourth to sixth embodiments described above, since the high-permeability magnetic film is formed on the non-magnetic substrate as an element main body to have a zigzag pattern, the absolute value of an impedance can be assured even if the entire length of the element main body in the magnetic field detection direction is made small, and the efficiency of a change in impedance of the element main body with respect to micro-magnetization can also be improved. For this reason, a stable, high output can be obtained. In addition, the problem of a sectional shape which cannot cope with micro-magnetization in a conventional amorphous wire and a problem of handling can be solved. Therefore, the element can be easily manufactured, and multiple formations can be made, so that the element can be provided at low cost. Since the length of the element main body in the magmatic field detection direction can be almost equal to that of the an MR element, an excellent MI effect can be performed to micro-magnetization, and the element can develop a new application in place of the MR element.

According to the magnetic head described as the seventh embodiment, the first and second high-permeability magnetic films are formed on the surface almost perpendicular to the magnetic recording medium sliding surface of the non-magnetic substrate. The first high-permeability magnetic film is formed to be at a distance from the medium sliding surface and to have a zigzag pattern, and the second high-permeability magnetic film overlaps the folded portions of the zigzag pattern on the medium sliding surface through an insulating film to extend to the medium sliding surface. With this arrangement, a stable, high reproduction output can be obtained as in the magnetic detecting element described above. Therefore, the magnetic head can be easily manufactured, and multiple formations can be made, so that the magnetic head can be provided at low cost. In addition, the magnetic head can be easily changed into a multi-track head. When the width and thickness of the end portion of the second high-permeability magnetic film exposed to the medium sliding surface are set, dimensions corresponding to a track width and a gap width can be desirably set. For this reason, an excellent effect that the application range of the magnetic head is wide can be obtained.

In each of the fourth to seventh embodiments described above, an arrangement in which a high-permeability magnetic film is formed on a non-magnetic substrate to have a zigzag pattern has been described. The description of the following embodiments will relate to an arrangement in which a conductive film formed to have a zigzag pattern is sandwiched by rectangular high-permeability magnetic films.

[Eighth Embodiment]

Figure 19:
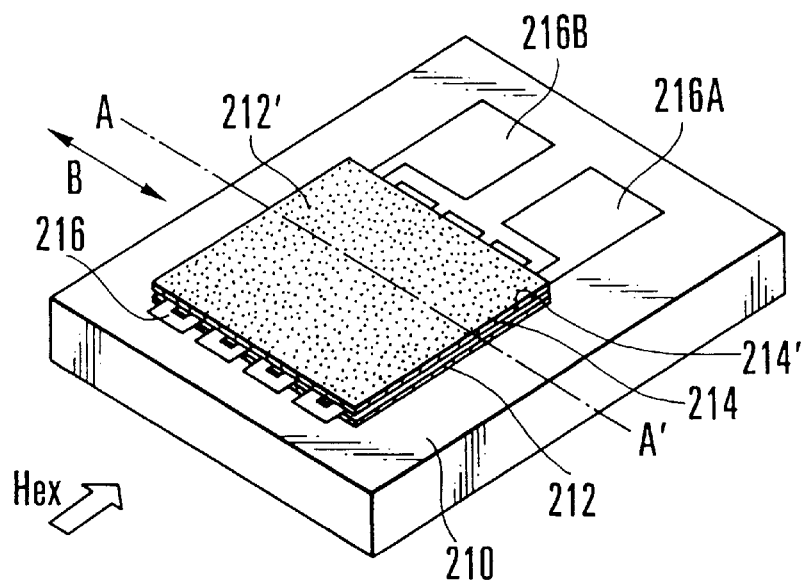
FIG. 19 is a perspective view showing the structure of a magnetic head according to the eighth embodiment.
Figure 20:
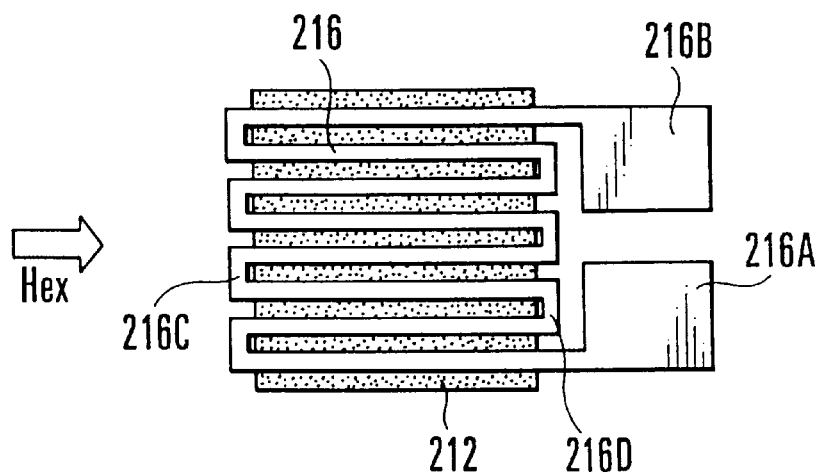
FIG. 20 is a plan view showing the zigzag pattern of the conductive film of the magnetic detecting element.
Figure 21:
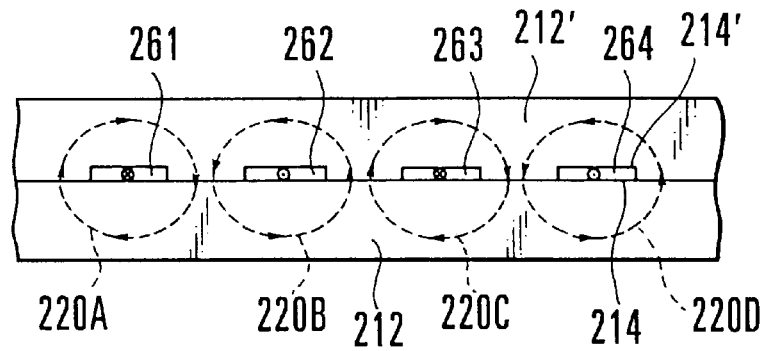
FIG. 21 is a sectional view showing, along an A–A' line in FIG. 19, a magnetic reflux generated by a current applied to the conductive film of the magnetic detecting element.

FIGS. 19 to 21 show an embodiment of a magnetic detecting element utilizing an MI effect as the eighth embodiment of the present invention. FIG. 19 shows the structure of the entire element.

In the arrangement of the magnetic detecting element shown in FIG. 19, a first rectangular high-permeability magnetic film 212 is formed on the upper surface of a non-magnetic substrate 210, a first insulating film 214 is stacked on the high-permeability magnetic film 212, and a conductive film 216 having a zigzag pattern is formed on the first insulating film 214. A second insulating film 214' is formed on the conductive film 216, and a second high-permeability magnetic film 212' is formed on the second insulating film 214'. Rectangular terminal portions 216A and 216B are formed on both the ends of the zigzag pattern of the conductive film 216, and external wires (not shown) for extracting an output from the element are connected to the terminal portions 216A and 216B by soldering, wire bonding, or the like.

In this arrangement, a high-frequency current is applied from the terminal portions 216A and 216B at both the ends to the conductive film 216, an impedance between the terminal portions 216A and 216B of the conductive film 216 is changed by an external magnetic field Hex, and this change in impedance is converted into an electric signal to obtain an output.

The details of the component members will be described below. The non-magnetic substrate 210 is made of a calcium titanate (Ti—Ca based ceramic), oxide glass, titania, alumina, or the like.

Each of the high-permeability magnetic films 212 and 212' is formed such that a magnetic film such as an Fe—Co—B based amorphous film or an Fe—C based or Fe—N based micro-crystalline film is formed by a vacuum film formation technique. At least one of the high-permeability magnetic films 212 and 212' is provided with a magnetic anisotropy by cooling in a magnetic field after film formation such that an easy direction of magnetization is along a direction of an arrow B in FIG. 19, which is a direction perpendicular to the magnetic field detection direction in which the external magnetic field Hex is applied in the plane of a corresponding one of the magnetic films. Both the high-permeability magnetic films 212 and 212' preferably have magnetic anisotropy such that easy directions of magnetization are the direction of the arrow B. However, in order to obtain an MI effect, the anisotropy of at least one of the magnetic films is assured without any problem. When the thicknesses of the magnetic films 212 and 212' are too small, the MI effect degrades. When the thicknesses of the magnetic films 212 and 212' are too large, the impedance decreases. For this reason, the thickness of each magnetic film is preferably set within the range of 1 $\mu$m to 20 $\mu$m.

Each of the insulating films 214 and 214' is formed such that an oxide insulating film made of $SiO_2$, $Cr_2O_3$, $TiO_2$, or the like, is formed by a vacuum film formation technique. The total thickness of the insulating films 214 and 214' corresponds to the width of the gap of a magnetic circuit constituted by the two upper and lower high-permeability magnetic films 212 and 212'. The thickness of each of the insulating films 214 and 214' preferably has a lower limit of 0.05 µm at which an insulating effect can be obtained, and preferably has an upper limit of 1 µm or less at which the value of an inductance generated by the high-permeability magnetic films 212 and 212' and the conductive film 216 does not decrease.

The conductive film 216 formed on the insulating film 214 is made of Cu, Au, or the like having a low resistivity, and is formed to have a pattern shown in FIG. 20. More specifically, in the zigzag pattern of the magnetic film 116, a plurality of straight portions each having a predetermined length and arranged along a magnetic field detection direction in which an external magnetic field Hex is applied are arranged in parallel at predetermined intervals, the end portions of the straight portions which are adjacent to each other to be sequentially folded are vertically bent as folded portions 216C and 216D to be connected to each other, and those portions are electrically connected in series with each other. As described above, the rectangular terminal portions 216A and 216B are formed at both the ends of the zigzag pattern o the conductive film 216.

FIG. 21 shows a section of the element cut along an A–A' in FIG. 19. As shown in FIG. 21, the directions of currents flowing in adjacent straight portions 261 to 264 are alternately reversed, and magnetic refluxes generated by the currents in the high-permeability magnetic films 212 and 212' form loops which are alternately reversed as indicated by reference numerals 220A to 220D in FIG. 21. Since small magnetic paths are formed around the straight portions of the conductive film 216 as indicated by the magnetic refluxes 220A to 220D, an inductance per conductive film 216 increases. In addition to this effect, the effect in which the length of the conductive film 216 can be obtained by the zigzag pattern is obtained. Therefore, even if the length of the element main body constituted by the high-permeability magnetic films 212 and 212', the insulating films 214 and 214', and the conductive film 216 in the magnetic field detection direction is small, a large inductance can be obtained. As a result, the large absolute value of the impedance can be obtained. In addition, the length of the element main body in the magnetic field can be almost equal to that of an MR element, and can perform an excellent MI effect with micro-magnetization.

Note that the folded portions 216C and 216D of the both the end portions of the zigzag pattern of the conductive film 216 shown in FIG. 20 generate a magnetic field having the same direction as the detection direction of the external magnetic field Hex by making a current flow into the conductive film 216. However, when the sizes and positions of the conductive film 216 and the high-permeability magnetic film 212 are determined such that the folded portions 216C and 216D are located outside the high-permeability magnetic film 212, flux interference in the high-permeability magnetic film 212 can be suppressed. Similarly, the conductive film 216 may be located outside the high-permeability magnetic film 212', if necessary. If at least one of the two high-permeability magnetic films 212 and 212' overlaps the folded portions 216C and 216D of the conductive film 216, the clear magnetic refluxes shown in FIG. 21 are not generated at the overlapping portion. Therefore, the sensitivity of the element is not influenced.

A result obtained by examining a sample of the magnetic detecting element of this embodiment will be described below. As the high-permeability magnetic films 212 and 212', upper and lower Fe—Ta—C based magnetic films each having a size of 0.2 mm×0.2 mm and a thickness of 5 µm were formed. The insulating films 214 and 214' each having a thickness of 0.1 µm were formed. The conductive film 216 was formed under the following conditions. That is, the thickness was set to be 1 µm the number of times of folding was set to be 7, the width of the straight portion was set to be 10 µm, and the interval between the straight portions was set to be 10 µm.

In order to measure the impedance, a 100-MHz high-frequency current was made to flow into the conductive film 216 to examine changes in voltage at both the ends.

An external magnetic field was applied by a Helmholtz coil, and was made to change within the range of ±25 [Oe].

As a result, an inductance at 100 MHz was 62 nH, and a Q value obtained at this time was 8.2. In contrast to this, when a conventional Fe—Co—B based amorphous wire having a diameter of 30 µm was used, an inductance L was 45 nH per 1 mm, and a Q value was 5.8. Although the length of the element of this embodiment was small, i.e., 0.2 mm, the inductance L and the Q value were large. An amount of change in impedance of the element of this embodiment was a preferable change of 68% when the external magnetic field was 8 [Oe].

In this manner, the magnetic detecting element of this embodiment has a large amount of change in impedance and high sensitivity, and can gain an inductance to assure the large absolute value of an impedance, thereby obtaining a stable, high output. Since the magnetic detecting element of this embodiment has a main body made of a thin film formed on a non-magnetic substrate, unlike an element utilizing an amorphous wire as an element main body, the element of this embodiment is free from the problem of bending and the difficulties of positioning and terminal extraction, and can be easily manufactured. In addition, so-called multiple formations in which, after a plurality of thin films serving as element main bodies are formed on a common non-magnetic substrate, the non-magnetic substrate is cut to manufacture a large number of elements at once can be performed.

[Ninth Embodiment]

The ninth embodiment in which the arrangement of the eighth embodiment is modified to obtain a reproducing magnetic head will be described below with reference to FIGS. 22 to 25. The same or corresponding reference numerals as in FIGS. 19 to 21 of the eighth embodiment denote the same parts in FIGS. 22 and 25, and a description thereof will be omitted.

Figure 22:
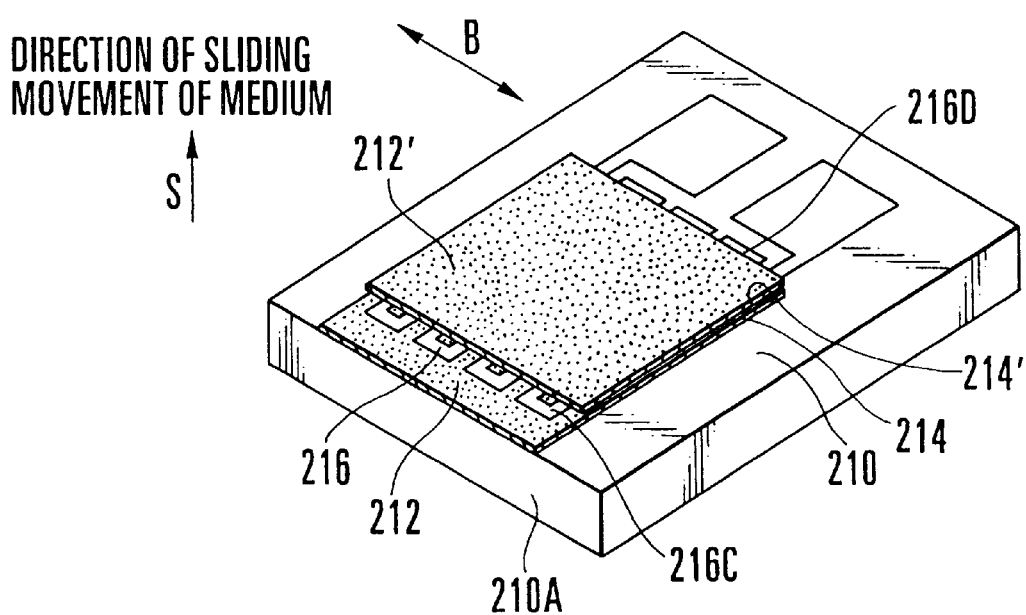
FIG. 22 is a perspective view showing the structure of a magnetic head according to the ninth embodiment.

In order to modify the arrangement of the magnetic detecting element in FIG. 19 of the eighth embodiment into a reproducing magnetic head, a first high-permeability magnetic film 212 is arranged to extend to the edge of an end surface of a non-magnetic substrate 210 as shown in FIG. 22. An end surface perpendicular to the upper surface of the non-magnetic substrate 210 on which the magnetic film 212 and other films 212', 214, 214', and 216 are formed is formed as a medium sliding surface 210A on which a magnetic recording medium (to be referred to as a medium hereinafter) (not shown)-slides, and an end portion of the high-permeability magnetic film 212 is exposed to the medium sliding surface 210A to be in contact with the medium The sliding direction is set to be the direction perpendicular to the film surface of the high-permeability magnetic film 212 as indicated by an arrow S. The thickness of the end portion of the high-permeability magnetic film 212 exposed to the non-magnetic substrate 210a corresponds to the gap width of an induction type magnetic head, and the width of the end portion of the high-permeability magnetic film 212 serves as a track width.

According to the positional relationship between the medium sliding surface 210A and the magnetic films 212 and 212', at least one of the magnetic films 212 and 212' has an easy direction of magnetization indicated by an arrow B which is parallel to the medium sliding surface 210A in the plane of a corresponding one of the magnetic films 212 and 212'. In addition, the direction of the zigzag pattern of the conductive film 216 is set such that the parallel straight portions are along a direction perpendicular to the medium sliding surface 210A.

If the conductive film 216 is brought into contact with the medium, a high-frequency current applied to the conductive film 216 might flow into the medium. For this reason, the conductive film 216 is arranged to be at a distance from the medium sliding surface 210A on the upper surface of the non-magnetic substrate 210.

The second high-permeability magnetic film 212' is at a distance from the medium sliding surface 210A on the upper surface of the non-magnetic substrate 210. The position and size of the second high-permeability magnetic film 212' are determined not to overlap folded portions 216C and 216D at both the end portions of the zigzag pattern of the conductive film 216.

With the above arrangement, in a reproducing operation, the magnetic recording medium (not shown) slides with respect to the medium sliding surface 210A, and a high-frequency current is applied to the magnetic film 216 from terminal portions 216A and 216B of both the ends thereof. Therefore, an impedance between the terminal portions 216A and 216B of the conductive film 216 is changed by a magnetic field from the recording magnetization of the medium, and the change in impedance is converted into an electric signal to obtain a reproduction output. By the same effect as that of the eighth embodiment, the magnetic head of this embodiment has high sensitivity, can gain an impedance, and can obtain a stable, high reproduction output. In addition, the magnetic head can be easily manufactured, and multiple formations can be made.

Figure 23:
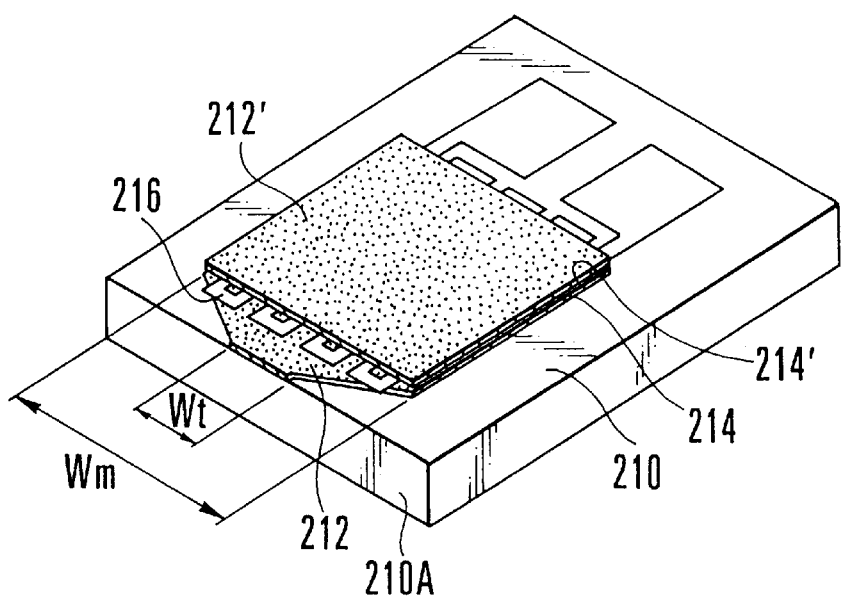
FIG. 23 is a perspective view showing the structure of a modification corresponding to a narrow track width of the magnetic head.

In the magnetic head of this embodiment, a track width can be desirably set by setting the width of the end portion of the magnetic film 212 exposed to the medium sliding surface 210A. For example, in order to cope with a track width smaller than the entire width of the magnetic film 212, as shown in FIG. 23, the width of the end portion of the high-permeability magnetic film 212 exposed to the medium sliding surface. 210A is decreased toward the sliding surface 210A, and a width Wt of the end portion is made smaller than an entire width Wm of the magnetic film 212. In this manner, the magnetic head of this embodiment can cope with the small track width Wt.

In addition, as the thickness of the end portion of the magnetic film 212 exposed to the medium sliding surface 210A is set, the thickness corresponding to the gap width of an induction type magnetic head can be desirably set. For example, as shown in FIG. 24, when the thickness Tg of the end portion of the magnetic film 212 exposed to the medium sliding surface 210A is made smaller than the thickness Tm of the remaining portion overlapping the magnetic film 216 to decrease the thickness corresponding to the gap width, a shaping loss for micro-magnetization can be improved.

Figure 24:
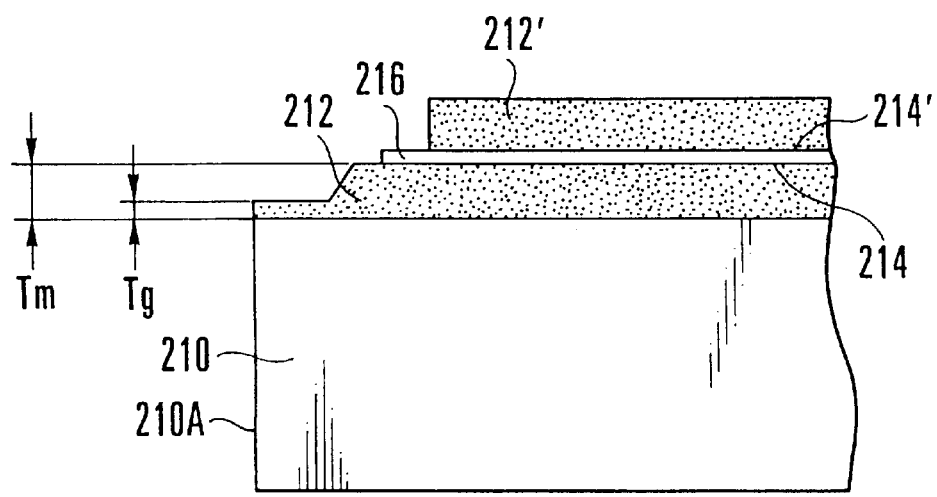
FIG. 24 is a sectional view showing the structure of a modification in which the thickness-of a magnetic film end portion exposed to the medium sliding surface of the magnetic head is decreased.

In each of the magnetic heads shown in FIGS. 22 to 24, the magnetic film 212 exposed to the medium sliding surface 210A is insulated from the conductive film 216 by the first insulating film 214. For this reason, the high-frequency current applied to the conductive film 216 does not flow into the medium through the magnetic film 212.

Figure 25:
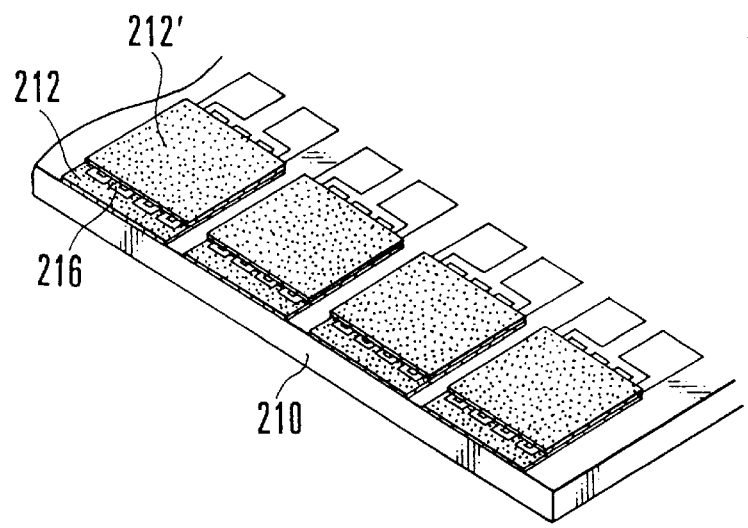
FIG. 25 is a perspective view showing a modification in which a head is constituted as a multi-track head.

When a plurality of element main bodies each constituted by the magnetic films 212 and 212', the insulating films 214 and 214', and the conductive film 216 are arranged in parallel on the upper surface of the non-magnetic substrate 210 as shown in FIG. 25, a multi-track head can be easily constituted. In this case, since the opposite areas of adjacent element main bodies are very small, crosstalk can be prevented.

[Tenth Embodiment]

Figure 26:
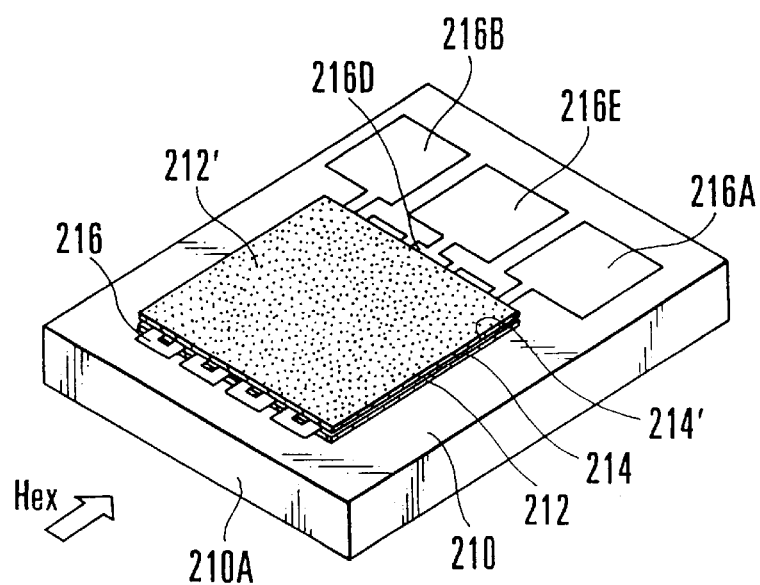
FIG. 26 is a perspective view showing the structure of a magnetic detecting element according to the tenth embodiment.

FIG. 26 shows a magnetic detecting element of the tenth embodiment obtained by modifying the arrangement of the eighth embodiment. In this embodiment, in the zigzag pattern of a conductive film 216, terminal portions 216A and 216B are formed to be connected to both the ends of the conductive film 216 on the side opposite to the magnetic detection side in which an external magnetic field Hex is applied, and a terminal portion 216E serving as a center tap is formed to be connected to a folded portion 216D of the intermediate portion of the conductive film 216. With the above arrangement, the element can be connected to an output circuit such that two divided changes in impedance of the element can be extracted.

Figure 27:
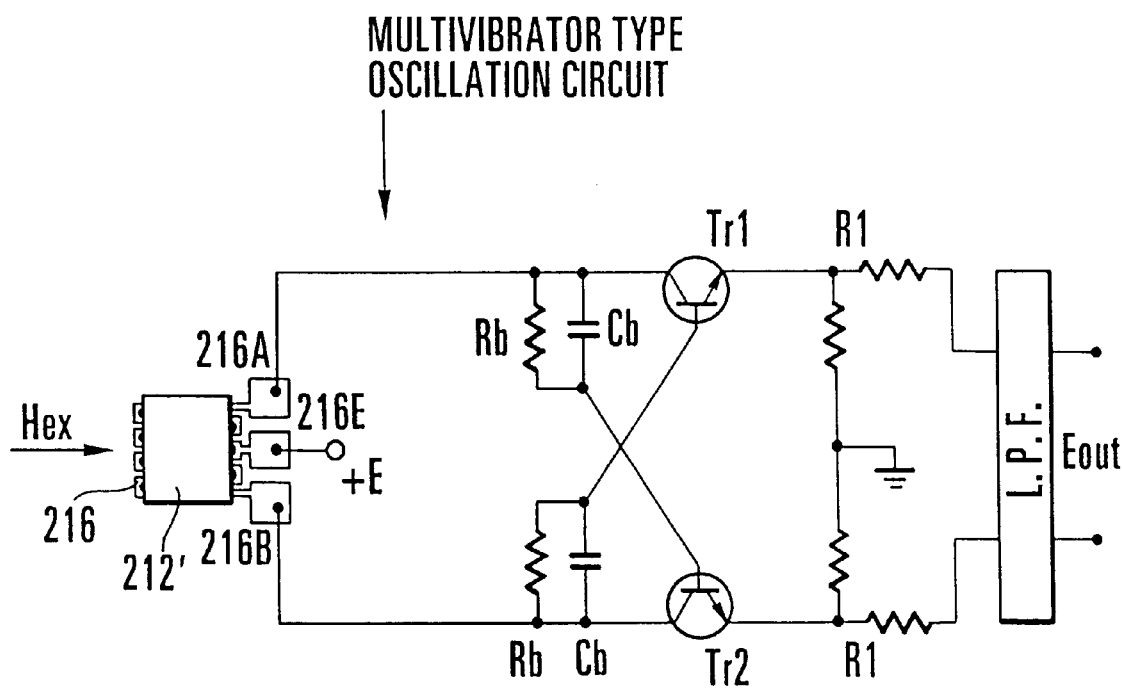
FIG. 27 is a circuit diagram of a multivibrator type oscillation circuit to which the magnetic detecting element is connected.

More specifically, for example, in the multivibrator type oscillation circuit shown in FIG. 27, the terminal portion 216E serving as a center tap is connected to a power supply +E, and the terminal portions 216A and 216B at both the ends are connected to the oscillation circuit. In this arrangement, since two divided changes in impedance are extracted from one element to be used, the characteristics of two oscillation sections are very symmetrical, and a stable output can be obtained.

When the magnetic detecting element is used to be connected to the oscillation circuit, a DC bias magnetic field must be applied to the magnetic detecting element along the external magnetic field detection direction. In this case, a biasing magnet or a DC magnetic field applying coil is arranged for the magnetic detecting element to apply the bias magnetic field. As a concrete arrangement, when a magnet is used, the magnet may be arranged on the upper side of the detecting element or on the back of the terminal portions 216A, 216B, and 216E, or when a coil is used, the coil may be arranged to surround the detecting element, or may be formed on the detecting element as one narrow long conductive film pattern.

In the element of this embodiment, a first high-permeability magnetic film 212 extends to the edge of an end surface of a non-magnetic substrate 210 in the arrangement in FIG. 26, and an end surface of the non-magnetic substrate 210 is formed as a medium sliding surface 210A. In this case, the element can be constituted as a reproducing magnetic head.

According to the magnetic detecting element in the eighth and tenth embodiments described above, the first high-permeability magnetic film, the first insulating film, the conductive film, the second insulating film, and the second high-permeability magnetic film are stacked, in order from below, on the non-magnetic substrate, and the conductive film is formed to have a zigzag pattern. In this manner, even if the length of the element main body in the magnetic field detection direction is decreased, the large absolute value of an impedance can be assured, and the efficiency of a change in impedance of the entire element with respect to micro-magnetization can also be improved, thereby obtaining a stable, high output. In addition, the problem of a sectional shape which cannot cope with micro-magnetization in a conventional amorphous wire and a problem of handling can be solved. Therefore, the element can be easily manufactured, and multiple formations can be made, so that the element can be provided at low cost. Since the length of the element in the magmatic field detection direction can be almost equal to that of the an MR element, an excellent MI effect can be performed with micro-magnetization, and the element can develop a new application in place of the MR element.

According to the magnetic head of the ninth embodiment, in an arrangement in which an end portion of the first high-permeability magnetic film is exposed to the medium sliding surface of the non-magnetic substrate in the same arrangement as that of the magnetic detecting element of the eighth embodiment, a stable, high reproduction output can be obtained as in the magnetic detecting element of the eighth embodiment. Therefore, the magnetic head can be easily manufactured, and multiple formations can be made, so that the magnetic head can be provided at low cost. In addition, the magnetic head can be easily changed into a multi-track head. When the width and thickness of the end portion of the first high-permeability magnetic film exposed to the medium sliding surface are set, the thickness corresponding to a track width and a gap width can be desirably set. For this reason, an excellent effect that the application range of the magnetic head is wide can be obtained.

What is claimed is:

1. A magnetic detecting element utilizing a magnetic impedance effect, characterized in that:
    said magnetic detecting element is constituted by stacking on a non-magnetic substrate, as layers in order from below, a high-permeability magnetic film, an insulating film and a conductive film which each have a substantially rectangular shape;
    each of the reactive layers of said high-permeability magnetic film, said insulating film and said conductive film is arranged to have a longitudinal direction along an applying direction of an external magnetic field to be detected;
    said high-permeability magnetic film has magnetic anisotropy such that an easy direction of magnetization is perpendicular to the longitudinal direction in a plane of said high permeability magnetic film;
    wherein
        a high-frequency current is applied to said conductive film from both end portions thereof in the longitudinal direction;
        a change in impedance generated by the external magnetic field between both field end portions of said conductive film in the longitudinal direction is converted into an electric signal to obtain an output; and
        an insulating film and a high-permeability magnetic film are further stacked on said conductive film.

2. A magnetic detecting element according to claim 1, wherein the thickness of said insulating film is 0.05 $\mu$m to 1 $\mu$m.

3. A magnetic detecting element according to claim 1, wherein said high-permeability magnetic film is a stacked layer obtained by alternately stacking a plurality of high-permeability magnetic films and insulating films.

4. A magnetic detecting element according to claim 1, wherein the total thickness of said insulating film, said conductive film and said insulating film among the layers stacked in order from below is 0.2 $\mu$m to 3 $\mu$m.

5. A magnetic detecting element according to claim 1, wherein a width of said conductive film in a direction perpendicular to the longitudinal direction in a plane of said conductive film is smaller than a width of said high-permeability magnetic film in the same direction.

6. A magnetic detecting element utilizing a magnetic impedance effect, characterized in that:
    said magnetic detecting element is constituted by stacking on a nonmagnetic substrate, as layers in order from below, a high-permeability magnetic film, an insulating film and a conductive film which each have a substantially rectangular shape;
    each of the respective layers of said high-permeability magnetic film, said insulating film, and said conductive film is arranged to have a longitudinal direction along an applying direction of an external magnetic field to be detected;
    said high-permeability magnetic film has magnetic anisotropy such that an easy direction of magnetization is perpendicular to the longitudinal direction in a plane of said high permeability magnetic film;
    wherein
        a high frequency current is applied to said conductive film from both end portions thereof in the longitudinal direction;
        a change in impedance generated by the external magnetic field between both the end portions of said conductive film in the longitudinal direction is converted into an electric signal to obtain an output; and
        said high-permeability magnetic film is a stacked layer obtained by alternately stacking a plurality of high-permeability magnetic films and insulating films.

7. A magnetic detecting element utilizing a magnetic impedance effect, characterized in that:
    said magnetic detecting element is constituted by stacking on a non-magnetic substrate, as layers in order from below, a high-permeability magnetic film and a conductive film which each have a substantially rectangular shape;
    each of the respective layers of said high-permeability magnetic film and said conductive film is arranged to have a longitudinal direction along an applying direction of an external magnetic field to be detected;
    said high-permeability magnetic film has an electric resistivity considerably higher than that of said conductive film and has magnetic anisotropy such that an easy direction of magnetization is perpendicular to the longitudinal direction in a plane of said high-permeability magnetic film;
    wherein
        a high-frequency current is applied to said conductive film from both end portions thereof in the longitudinal direction;
        a change in impedance generated by the external magnetic field between both the end portions of said conductive film in the longitudinal direction is converted into an electrical signal to obtain an output; and
        a high-permeability magnetic film is further stacked on said conductive film.

8. A magnetic detecting element according to claim 7, wherein a width of said conductive film in a direction perpendicular to the longitudinal direction in a plane of said conductive film is smaller than a width of said high-permeability magnetic film in the same direction.

9. A magnetic detecting element utilizing a magnetic impedance effect, characterized in that:
    said magnetic detecting element is constituted by stacking on a non-magnetic substrate, as layers in order from below, a first high-permeability magnetic film, a first insulating film, a conductive film, a second insulating film and a second high-permeability magnetic film;
    at least one of said first and second high-permeability magnetic films has magnetic anisotropy such that an easy direction of magnetization is perpendicular to a magnetic field detection direction in a plane of the at least one of said first and second high-permeability magnetic films;

said conductive film is formed to have a zigzag pattern having a plurality of straight portions along the magnetic field detection direction which are arranged in parallel at predetermined intervals and interconnected to be sequentially folded and to be electrically connected in series with each other;

wherein
- a high-frequency current is applied from both end portions of said conductive film; and
- a change in impedance generated by an external magnetic field between both the end portions of said conductive film is converted into an electric signal to obtain an output.

10. A magnetic detecting element according to claim 9, wherein at least one of said first and second high-permeability magnetic films is arranged not to overlap folded portions of end portions of the zigzag pattern of said conductive film.

11. A magnetic detecting element according to claim 9, wherein the thickness of each of said first and second insulating films is 0.05 $\mu$m to 1 $\mu$m.

12. A magnetic detecting element according to claim 9, wherein the thickness of each of said first and second high-permeability magnetic films is 1 $\mu$m to 20 $\mu$m.

13. A magnetic detecting element according to claim 9, wherein terminal portions are formed on both end portions of the zigzag pattern of said conductive film, and a terminal portion serving as a center tap is formed to be connected to a folded portion of an intermediate portion of the zigzag pattern of said conductive film.

14. A magnetic head for reproduction utilizing a magnetic impedance effect, characterized in that:

said magnetic head is constituted by forming, as layers in order from below, a first high-permeability magnetic film, a first insulating film, a conductive film, a second insulating film and a second high-permeability magnetic film on an upper surface, of a non-magnetic substrate having an end surface formed as a magnetic recording medium sliding surface, substantially perpendicular to the sliding surface;

at least one of said first and second high-permeability magnetic films has magnetic anisotropy such that an easy direction of magnetization is substantially parallel to the sliding direction in a plane of the at least one of said first and second high-permeability magnetic films;

said first high-permeability magnetic film has an end portion exposed to the sliding surface;

said conductive film is formed to have a zigzag pattern having a plurality of straight portions along a direction substantially perpendicular to the sliding surface which are arranged in parallel at predetermined intervals and interconnected to be sequentially folded and to be electrically connected in series with each other;

wherein
- a high-frequency current is applied from both end portions of said conductive film; and
- a change in impedance generated between both the end portions of said conductive film by a magnetic field from a magnetic recording medium is converted into an electric signal to obtain a reproduction output.

15. A magnetic head according to claim 14, wherein the width of an end portion of said first high-permeability magnetic film exposed to the sliding surface is decreased toward the sliding surface.

16. A magnetic head according to claim 14, wherein the thickness of an end portion of said first high-permeability magnetic film exposed to said sliding surface is made smaller than the thickness of an overlapping portion between said first high-permeability magnetic film and said conductive film.

17. A magnetic head according to claim 14, wherein a plurality of element main bodies each constituted by said first and second high-permeability magnetic films, said first and second insulating films and said conductive film are arranged in parallel on the upper surface of said non-magnetic substrate.

18. A magnetic head according to claim 14, wherein terminal portions are formed on both end portions of the zigzag pattern of said conductive film, and a terminal portion serving as a center tap is formed to be connected to a folded portion of an intermediate portion of the zigzag pattern of said conductive film.

19. A magnetic head according to claim 18, wherein the end portion serving as the center tap is connected to a power supply, and the terminal portions of both the end portions are connected to a multivibrator type oscillation circuit.

* * * * *

UNITED STATES PATENT AND TRADEMARK OFFICE
CERTIFICATE OF CORRECTION

PATENT NO.    : 6,351,119 B1
DATED         : February 26, 2002
INVENTOR(S)   : Masahiro Kawase It is certified that error appears in the above-identified patent and that said Letters Patent is hereby corrected as shown below:

Column 6,
Line 7, delete "thickness-of" and insert -- thickness of --.

Column 10,
Line 64, delete "ah" and insert -- an --.

Column 18,
Line 55, delete "(not shown)-slides," and insert -- (not shown) slides, --.

Column 21,
Line 29, delete "reactive" and insert -- respective --.

Signed and Sealed this

Ninth Day of September, 2003

JAMES E. ROGAN
*Director of the United States Patent and Trademark Office*